(12) United States Patent
Uemura

(10) Patent No.: US 10,422,832 B2
(45) Date of Patent: Sep. 24, 2019

(54) SEQUENTIAL CIRCUIT, SCAN CHAIN CIRCUIT INCLUDING THE SAME AND INTEGRATED CIRCUIT INCLUDING THE SAME

(71) Applicant: SAMSUNG ELECTRONICS CO., LTD., Suwon-si, Gyeonggi-do (KR)

(72) Inventor: Taiki Uemura, Seongnam-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 310 days.

(21) Appl. No.: 15/590,180

(22) Filed: May 9, 2017

(65) Prior Publication Data

US 2018/0088176 A1     Mar. 29, 2018

(30) Foreign Application Priority Data

Sep. 27, 2016 (KR) .......................... 10-2016-0123811

(51) Int. Cl.
| | |
|---|---|
| G01R 31/3185 | (2006.01) |
| G01R 31/317 | (2006.01) |
| G01R 31/3177 | (2006.01) |
| G01R 31/3183 | (2006.01) |
| H03K 19/003 | (2006.01) |
| H03K 19/20 | (2006.01) |

(52) U.S. Cl.
CPC . *G01R 31/318536* (2013.01); *G01R 31/3177* (2013.01); *G01R 31/31704* (2013.01); *G01R 31/318392* (2013.01); *G01R 31/318522* (2013.01); *G01R 31/318552* (2013.01); *G01R 31/318555* (2013.01); *H03K 19/00323* (2013.01); *H03K 19/00369* (2013.01); *H03K 19/20* (2013.01)

(58) Field of Classification Search
CPC .............................................. G01R 31/318536
USPC .................................................. 714/728, 731
See application file for complete search history.

(56) References Cited

U.S. PATENT DOCUMENTS

| | | | |
|---|---|---|---|
| 5,539,344 | A | 7/1996 | Hatakenaka |
| 6,646,464 | B2 | 11/2003 | Maruyama |
| 7,737,721 | B2 | 6/2010 | Fukuoka |
| 8,217,458 | B2 | 7/2012 | Golke et al. |
| 8,427,215 | B2 | 4/2013 | Uemura |
| 8,441,294 | B2 | 5/2013 | Uemura et al. |
| 8,975,913 | B2 | 3/2015 | Smith |
| 2006/0119410 | A1 | 6/2006 | Carlson |
| 2008/0042714 | A1 | 2/2008 | Otake et al. |
| 2016/0116888 | A1 | 4/2016 | Dominguez |

FOREIGN PATENT DOCUMENTS

JP         5707964 B2     3/2015

*Primary Examiner* — Fritz Alphonse
(74) *Attorney, Agent, or Firm* — Lee & Morse, P.C.

(57) ABSTRACT

A sequential circuit includes a data input terminal, a data path, and a redundant feedback loop. The data input terminal receives input data. The data path is connected to the data input terminal and transmits the input data to a data output terminal based on a first clock signal and a second clock signal. The redundant feedback loop is connected to the first data path and stores first data based on at least one of the first or second clock signals when the first data is equal to second data. The first data corresponds to the input data. The second clock signal is a delayed signal of the first clock signal. The second data is delayed data of the first data.

20 Claims, 20 Drawing Sheets

FIG. 2

| M1 | M2 | WD |
|----|----|----|
| 0  | 0  | 0  |
| 1  | 1  | 1  |
| 1  | 0  | NO WRITE |
| 0  | 1  | NO WRITE |

SEQUENTIAL CIRCUIT, SCAN CHAIN CIRCUIT INCLUDING THE SAME AND INTEGRATED CIRCUIT INCLUDING THE SAME

CROSS-REFERENCE TO RELATED APPLICATION

Korean Patent Application No. 10-2016-0123811, filed on Sep. 27, 2016, and entitled, "Sequential Circuit, Scan Chain Circuit Including the Same and Integrated Circuit Including the Same," is incorporated by reference herein in its entirety.

BACKGROUND

1. Field

One or more embodiments described herein relate a sequential circuit, a scan chain circuits including a sequential circuit, and integrated circuit including a sequential circuit and/or a scan chain circuit.

2. Description of the Related Art

A variety of errors can occur in an integrated circuit. One type of error, known as a hard error, occurs when there is a permanent breakdown of a particular part of an integrated circuit. Another type of error, known as a soft error, is an operation-restorable transient error that may randomly occur in an integrated circuit.

There are many types of soft errors. One type of soft error is a single event transient (SET). This type of error occurs when there is a momentary voltage excursion (or voltage spike) at a node in an integrated circuit as the result of a single energetic particle strike. When this occurs, the node will typically return to the desired voltage state. Thus, SET errors may not be a problem in and of themselves. However, in some integrated circuits, an SET error may occur based on a change in the output of the integrated circuit as the result of a temporary voltage disturbance.

SUMMARY

In accordance with one or more embodiments, a sequential circuit includes a data input terminal to receive input data; a first data path, connected to the data input terminal, to transmit the input data to a data output terminal based on a first clock signal and a second clock signal; and a redundant feedback loop, connected to the first data path, to store first data based on at least one of the first or second clock signals when the first data is equal to second data, wherein the first data corresponds to the input data, wherein the second clock signal is a delayed signal of the first clock signal, and wherein the second data is delayed data of the first data.

In accordance with one or more other embodiments, a scan chain circuit includes first through N-th sequential circuits connected in series to sequentially transfer input data based on an input clock signal, where N is a natural number equal to or greater than two, wherein the first sequential circuit includes: a data input terminal to receive the input data; a first data path, connected to the data input terminal, to transmit the input data to a data output terminal based on a first clock signal and a second clock signal, the first clock signal corresponding to the input clock signal and the second clock signal being a delayed signal of the first clock signal; and a redundant feedback loop, connected to the first data path, to store first data based on at least one of the first or second clock signals when the first data is equal to second data, wherein the first data corresponds to the input data and wherein the second data is delayed data of the first data.

In accordance with one or more other embodiments, an integrated circuit includes a first sequential circuit to transfer input data based on a first clock signal and a second clock signal, the second clock signal being a delayed signal of the first clock signal, wherein the first sequential circuit includes: a data input terminal to receive the input data; a first data path, connected to the data input terminal, to transmit the input data to a data output terminal based on the first clock signal and the second clock signal; and a redundant feedback loop, connected to the first data path, to store first data based on at least one of the first or second clock signals when the first data is equal to the second data, wherein the first data corresponds to the input data and wherein the second data is delayed data of the first data.

In accordance with one or more other embodiments, a circuit includes a data path, connected to a data input terminal, to transmit input data to an output terminal based on different clock signals; and a redundant feedback loop, connected to the data path, to store first data based on at least one of the different clock signals when a difference between the first data and second data is in a predetermined range, wherein the first data corresponds to the input data, wherein a first clock signal of the different clock signals is delayed relative to a second clock signal of the different clock signals, and wherein the second data is delayed data of the first data.

BRIEF DESCRIPTION OF THE DRAWINGS

Features will become apparent to those of skill in the art by describing in detail exemplary embodiments with reference to the attached drawings in which:

FIG. 2 illustrates an embodiment of a table for describing the operation of a redundant feedback loop in a sequential circuit;

DETAILED DESCRIPTION

Figure 1:
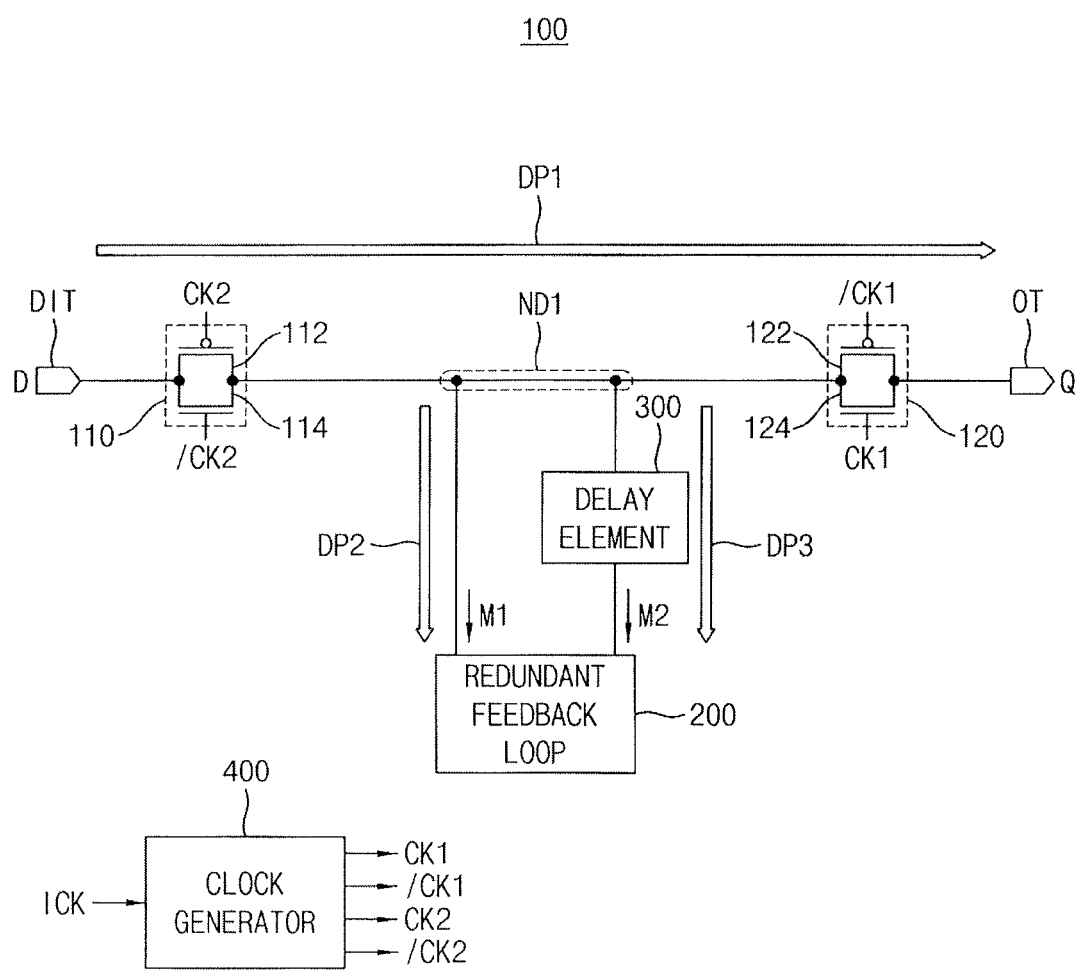
FIG. 1 illustrates an embodiment of a sequential circuit.

FIG. 1 illustrates an embodiment of a sequential circuit 100 which includes a data input terminal DIT, a first data path DP1 and a redundant feedback loop 200. The sequential circuit 100 may further include a data output terminal OT, a second data path DP2, a third data path DP3, and a clock generator 400. In one embodiment, the sequential circuit 100 may represent a data retention circuit or a data holding circuit that stores or maintains data at a predetermined time or point based on a clock signal. For example, the sequential circuit 100 may include a latch circuit or a flip-flop circuit.

The data input terminal DIT receives input data D and provides output data Q corresponding to the input data D.

The first data path DP1 is connected to the data input terminal DIT and the data output terminal OT. For example, the first data path DP1 may be between the data input terminal DIT and the data output terminal OT. The first data path DP1 may not include an element for delaying the transfer, transmission, or propagation of signals. The first data path DP1 transmits the input data D from the data input terminal DIT to the data output terminal OT based on a first clock signal CK1 and a second clock signal CK2. The second clock signal CK2 is a delayed signal of the first clock signal CK1. The first clock signal CK1 may be referred to as a normal clock signal, and the second clock signal CK2 may be referred to as a delayed clock signal.

The redundant feedback loop 200 is connected to the first data path DP1. For example, the redundant feedback loop 200 may be connected to a first data node ND1 on the first data path DP1. When first data M1 is substantially the same as second data M2, the redundant feedback loop 200 stores the first data M1 (or the second data M2) based on at least one of the first or second clock signals CK1 and CK2. The first data M1 corresponds to the input data D. For example, the first data M1 may be data at the first data node ND1 and may be substantially the same as the input data D. The second data M2 is delayed data of the first data M1.

The second data path DP2 and the third data path DP3 may be connected in parallel between the first data node ND1 and the redundant feedback loop 200. The second data path DP2 may provide the first data M1 to the redundant feedback loop 200. The third data path DP3 may include a delay element 300 that generates the second data M2 by delaying the first data M1. The second data M2 may be provided to the redundant feedback loop 200.

The clock generator 400 may generate the first clock signal CK1 based on an input clock signal ICK and may generate the second clock signal CK2 by delaying the input clock signal ICK. The clock generator 400 may further generate an inverted first clock signal /CK1 based on the input clock signal ICK and an inverted second clock signal /CK2 by delaying the input clock signal ICK. The inverted first clock signal /CK1 may be an inversion signal of the first clock signal CK1. For example, the phase of the inverted first clock signal /CK1 may be opposite to or reversed with the phase of the first clock signal CK1. The inverted second clock signal /CK2 may be an inversion signal of the second clock signal CK2. In some example embodiments, the clock generator 400 may be outside the sequential circuit 100.

In some example embodiments, the first data path DP1 may include a first transfer gate 110 and a second transfer gate 120. The first transfer gate 110 may electrically connect the data input terminal DIT with the first data node ND1 based on the second clock signal CK2. The second transfer gate 120 may electrically connect the first data node ND1 with the data output terminal OT based on first clock signal CK1.

The first transfer gate 110 may include a p-type metal oxide semiconductor (PMOS) transistor 112 and a n-type metal oxide semiconductor (NMOS) transistor 114 connected in parallel between the data input terminal DIT and the first data node ND1. The PMOS transistor 112 may have a gate electrode to receive the second clock signal CK2. The NMOS transistor 114 may have a gate electrode receiving the inverted second clock signal /CK2. The second transfer gate 120 may include a PMOS transistor 122 and a NMOS transistor 124 connected in parallel between the first data node ND1 and the data output terminal OT. The PMOS transistor 122 may have a gate electrode to receive the inverted first clock signal /CK1. The NMOS transistor 124 may have a gate electrode to receive the first clock signal CK1.

In one embodiment, the sequential circuit 100 may operate based on the clock signals CK1 and CK2 having different timings. The sequential circuit 100 may store data into the redundant feedback loop 200 only when the data M1 and M2 having different timings are substantially the same. Accordingly, the hold time of the sequential circuit 100 may increase. As a result, a malfunction due to a single event transient (SET) may be prevented in the sequential circuit 100.

In addition, in one embodiment, the sequential circuit 100 may include the first data path DP1 that directly connects the data input terminal DIT with the data output terminal OT, without an element for delaying the transfer, transmission, or propagation of signals. Accordingly, the setup time and delay time of the sequential circuit 100 may not increase. As a result, sequential circuit 100 may have relatively robust characteristic for the SET without degrading performance.

Figure 2:
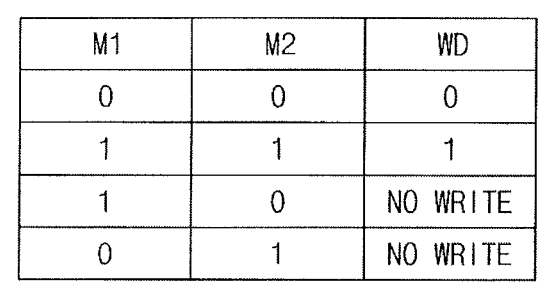

FIG. 2 illustrates an embodiment of the operation of the redundant feedback loop 200 in the sequential circuit 100. Referring to FIGS. 1 and 2, the first data M1 (or the second data M2) may be stored into the redundant feedback loop 200 when the first data M1 is substantially the same as the second data M2. The first data M1 (or the second data M2) may not be stored into the redundant feedback loop 200 when the first data M1 is different from the second data M2.

For example, data "0" may be stored into the redundant feedback loop 200 based on at least one of the first or second clock signals CK1 and CK2, when the first data M1 and the second data M2 are about "0." Data "1" may be stored into the redundant feedback loop 200 based on at least one of the first or second clock signals CK1 and CK2, when the first data M1 and the second data M2 are about "1." Thus, when the first data M1 and the second data M2 are substantially the same, data WD in the redundant feedback loop 200 may be changed or maintained, so that the data WD in the redundant feedback loop 200 is substantially the same as the first and second data M1 and M2.

The first data M1 or the second data M2 may not be stored into the redundant feedback loop 200 when one of the first or second data M1 and M2 is about "0" and the other of the first or second data M1 and M2 is about "1." Thus, when the first data M1 and the second data M2 are different, the data WD in the redundant feedback loop 200 may not be changed and may be maintained to previously stored data.

Figure 3:
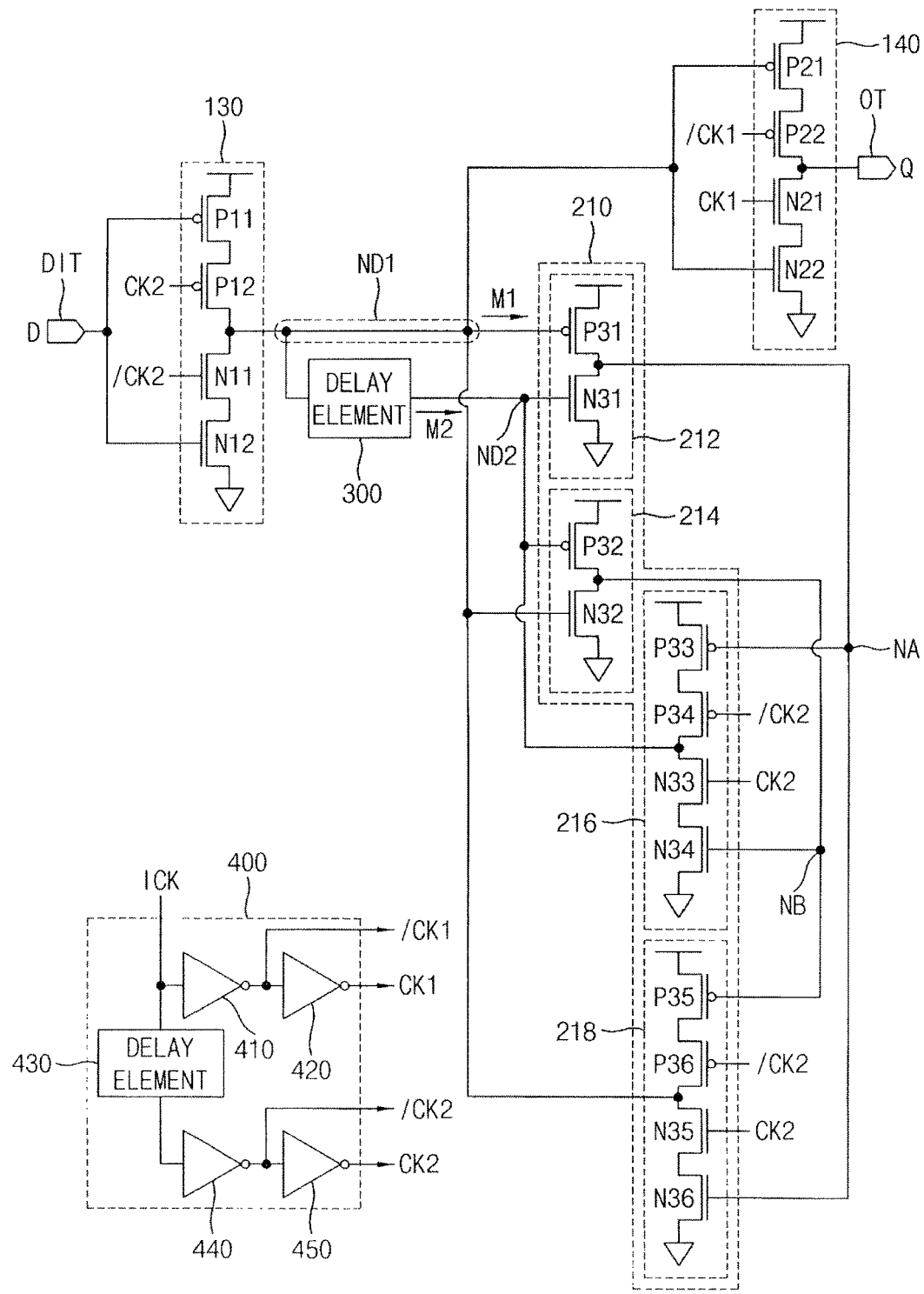
FIG. 3 illustrates a circuit embodiment of a sequential circuit.
Figure 4A:
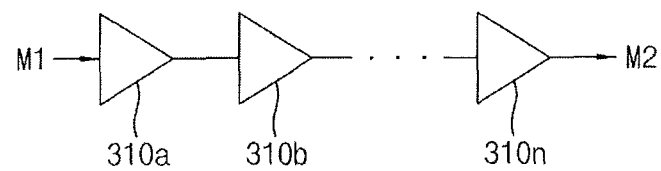
FIGS. 4A and 4B illustrate circuit embodiments of a delay element in the sequential circuit in FIG. 3.
Figure 4B:
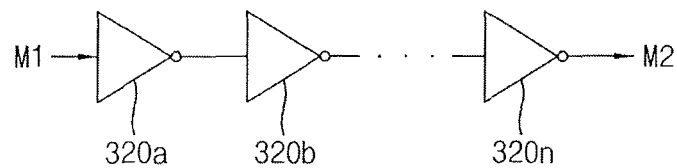

FIG. 3 illustrates a circuit embodiment of a sequential circuit 100a, which, for example, may correspond to the sequential circuit 100. FIGS. 4A and 4B illustrate embodiments of a delay element that may be included in the sequential circuit of FIG. 3.

Referring to FIGS. 3, 4A, and 4B, a sequential circuit 100a may include the data input terminal DIT, the data output terminal OT, logic gates 130 and 140, a first latch 210, the delay element 300 and the clock generator 400. The logic gates 130 and 140 may respectively correspond to the transfer gates 110 and 120 in FIG. 1. For example, each of the logic gates 130 and 140 may be a gated inverter, and each of the transfer gates 110 and 120 may be in a respective gated inverter.

The logic gate 130 may include an input terminal connected to the data input terminal DIT and an output terminal connected to the first data node ND1. The logic gate 130 may operate based on the second clock signal CK2. For example, the logic gate 130 may generate the first data M1 by inverting the input data D based on the second clock signal CK2. The logic gate 140 may include an input terminal connected to the first data node ND1 and an output terminal connected to the data output terminal OT. The logic gate 140 may operate based on the first clock signal CK1. For example, the logic gate 140 may generate the output data Q by inverting a voltage at the first data node ND1 based on the first clock signal CK1.

The logic gate 130 may include PMOS transistors P11 and P12 connected in series between a power supply voltage (e.g., a VDD voltage) and the first data node ND1, and NMOS transistors N11 and N12 that are connected in series between the first data node ND1 and a ground voltage (e.g., a VSS voltage). The PMOS transistor P11 may have a gate electrode connected to the data input terminal DIT. The PMOS transistor P12 may have a gate electrode receiving the second clock signal CK2. The NMOS transistor N11 may have a gate electrode to receive the inverted second clock signal /CK2. The NMOS transistor N12 may have a gate electrode connected to the data input terminal DIT.

The logic gate 140 may include PMOS transistors P21 and P22 connected in series between the power supply voltage and the data output terminal OT, and NMOS transistors N21 and N22 connected in series between the data output terminal OT and the ground voltage. The PMOS transistor P21 may have a gate electrode connected to the first data node ND1. The PMOS transistor P22 may have a gate electrode to receive the inverted first clock signal /CK1. The NMOS transistor N21 may have a gate electrode to receive the first clock signal CK1. The NMOS transistor N22 may have a gate electrode connected to the first data node ND1.

In FIG. 3 and other example figures, a horizontal line (e.g., -) connected to a source electrode of each PMOS transistor may represent the power supply voltage. An inverse triangle (e.g., ∇) connected to a drain electrode of each NMOS transistor may represent a reference or ground voltage.

The delay element 300 may be connected between the first data node ND1 and a second data node ND2, and may generate the second data M2 by delaying the first data M1. For example, in FIG. 4A, delay element 300a may include at least one buffer (e.g., cascaded-connected buffers 310a, 310b, 310n) for delaying the first data M1. In another example, in FIG. 4B, delay element 300b may include at least one inverter (e.g., cascaded-connected inverters 320a, 320b, ..., 320n) for delaying the first data M1.

In FIG. 3, the logic gates 130 and 140 and the first data node ND1 are between the data input terminal DIT and the data output terminal OT and may correspond to the first data path DP1 in FIG. 1. At least one path between the first data node ND1 and the first latch 210 and which provides the first data M1 may correspond to the second data path DP2 in FIG. 1. At least one path, between the first data node ND1 and the first latch 210 may include the delay element 300, may provide the second data M2 and may correspond to the third data path DP3 in FIG. 1. The first data node ND1 may be on the first data path DP1. The first data M1 may be provided directly from the first data node ND1. The second data M2 may be provided from the second data node ND2 on the third data path DP3.

The first latch 210 in FIG. 3 may correspond to the redundant feedback loop 200 in FIG. 1. For example, the redundant feedback loop may include one latch 210 in the example of FIG. 3. The sequential circuit 100a of FIG. 3, in which the redundant feedback loop includes one latch 210, may be considered to be a latch circuit. The first latch 210 may be connected to the first data node ND1 and the second data node ND2 and may store the first data M1 based on the second clock signal CK2 when the first data M1 is substantially the same as the second data M2.

The first latch 210 may include a first logic gate 212, a second logic gate 214, a third logic gate 216 and a fourth logic gate 218. The first logic gate 212 may have a first input terminal connected to the first data node ND1, a second input terminal connected to the second data node ND2, and an output terminal connected to a first node NA. The first logic gate 212 may include a PMOS transistor P31 connected between the power supply voltage and the first node NA, and a NMOS transistor N31 connected between the first node NA and the ground voltage. The PMOS transistor P31 may have a gate electrode connected to the first data node ND1. The NMOS transistor N31 may have a gate electrode connected to the second data node ND2.

The second logic gate 214 may have a first input terminal connected to the second data node ND2, a second input terminal connected to the first data node ND1, and an output terminal connected to a second node NB. The second logic gate 214 may include a PMOS transistor P32 connected between the power supply voltage and the second node NB, and a NMOS transistor N32 connected between the second node NB and the ground voltage. The PMOS transistor P32 may have a gate electrode connected to the second data node ND2. The NMOS transistor N32 may have a gate electrode connected to the first data node ND1.

The third logic gate 216 may have a first input terminal connected to the first node NA, a second input terminal connected to the second node NB, and an output terminal connected to the second data node ND2. The third logic gate 216 may operate based on the second clock signal CK2. The third logic gate 216 may include PMOS transistors P33 and P34 connected in series between the power supply voltage and the second data node ND2, and NMOS transistors N33 and N34 connected in series between the second data node ND2 and the ground voltage. The PMOS transistor P33 may have a gate electrode connected to the first node NA. The PMOS transistor P34 may have a gate electrode to receive the inverted second clock signal /CK2. The NMOS transistor N33 may have a gate electrode to receive the second clock signal CK2. The NMOS transistor N34 may have a gate electrode connected to the second node NB.

The fourth logic gate 218 may have a first input terminal connected to the second node NB, a second input terminal connected to the first node NA, and an output terminal connected to the first data node ND1. The fourth logic gate 218 may operate based on the second clock signal CK2. The fourth logic gate 218 may include PMOS transistors P35 and P36 connected in series between the power supply voltage and the first data node ND1, and NMOS transistors N35 and N36 connected in series between the first data node ND1 and the ground voltage. The PMOS transistor P35 may have a gate electrode connected to the second node NB. The PMOS transistor P36 may have a gate electrode to receive the inverted second clock signal /CK2. The NMOS transistor N35 may have a gate electrode to receive the second clock signal CK2. The NMOS transistor N36 may have a gate electrode connected to the first node NA.

Different from a normal inverter, two input terminals in each of the first and second logic gates 212 and 214 may be connected to two different nodes ND1 and ND2 and operate as an inverter only when voltages at two nodes ND1 and ND2 (e.g., two data M1 and M2) are substantially the same. Different from a normal gated inverter, two input terminals in each of the third and fourth logic gates 216 and 218 may be connected to two different nodes NA and NB and operate as a gated inverter only when voltages at two nodes NA and NB are substantially the same. Each of the first and second logic gates 212 and 214 may be referred to as a two-input inverter. Each of the third and fourth logic gates 216 and 218 may be referred to as a two-input gated inverter. The first latch 210 may include two-input inverters and two-input gated inverters, and thus may store the first data M1 only when the first data M1 and second data M2 are substantially equal.

The clock generator 400 may include a first inverter 410, a second inverter 420, a delay element 430, a third inverter 440, and a fourth inverter 450. The first inverter 410 may generate the inverted first clock signal /CK1 by inverting the input clock signal ICK. The second inverter 420 may generate the first clock signal CK1 by inverting the inverted first clock signal /CK1. The delay element 430 may delay the input clock signal ICK. The third inverter 440 may generate the inverted second clock signal /CK2 by inverting an output of the delay element 430. The fourth inverter 450 may generate the second clock signal CK2 by inverting the inverted second clock signal /CK2. The delay element 430 may have a configuration substantially the same as delay element 300.

The order of arrangement of the PMOS transistors P11 and P12 between the power supply voltage and first data node ND1 may be different in another embodiment. The order of arrangement of the transistors N11, N12, P21, P22, N21, N22, P33, P34, N33, N34, P35, P36, N35 and N36 may also be different in another embodiment.

Figure 5A:
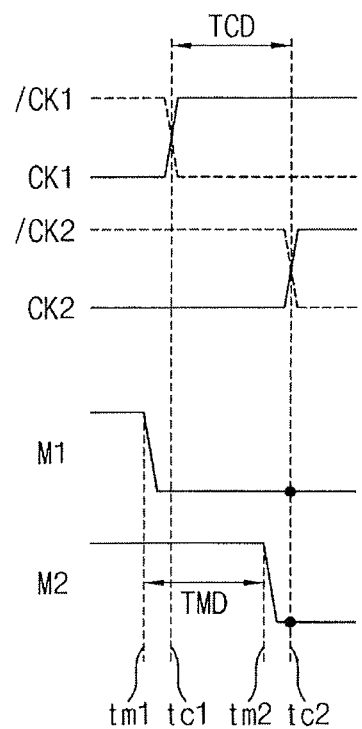
FIGS. 5A to 5C illustrate embodiments of the operation of a sequential circuit.
Figure 5B:
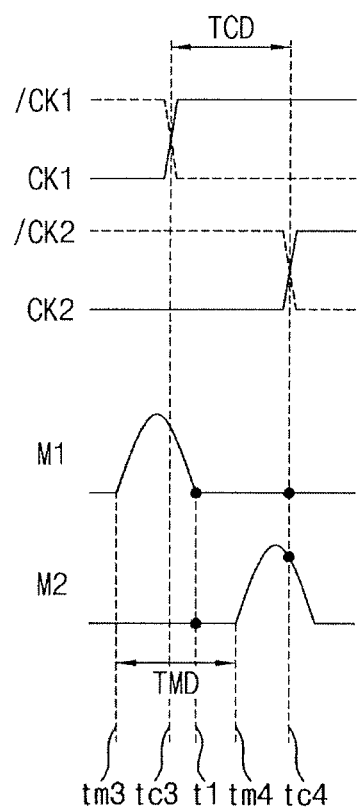
Figure 5C:
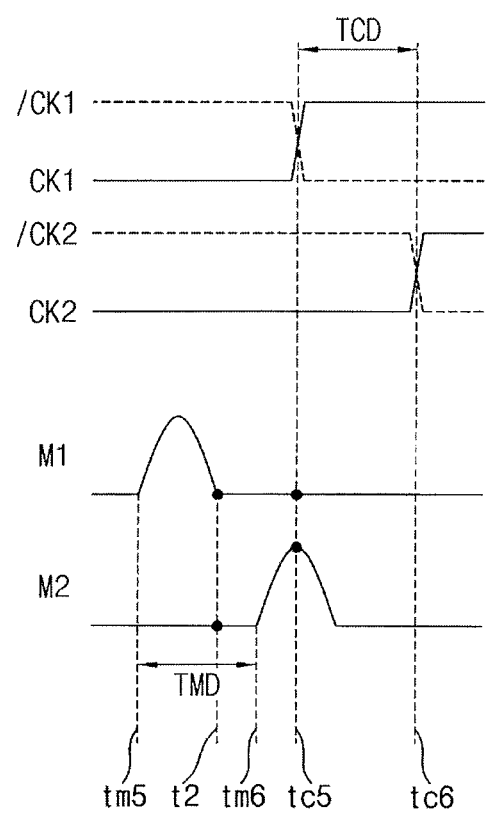

FIGS. 5A, 5B and 5C illustrate embodiments for operating a sequential circuit, such as a sequential circuit in accordance with one or more of the embodiments described herein. FIG. 5A illustrates a normal operation of the sequential circuit. FIG. 5B illustrates operation of the sequential circuit when a SET occurs on the first data M1 at a timing point adjacent to or neighboring a rising edge of the first clock signal CK1. FIG. 5C illustrates operation of the sequential circuit when a SET occurs on the second data M2 at a timing point adjacent to or neighboring a rising edge of the first clock signal CK1. In FIGS. 5A, 5B and 5C, TCD represents a clock delaying time by the delay element 430 in FIG. 3, and TMD represents a data delaying time by the delay element 300 in FIG. 1.

Referring to FIGS. 3 and 5A, before time tm1, the first and second data M1 and M2 have a logic high level. Thus, data "1" corresponding to the logic high level is stored in the first latch 210. At time tm1, the first data M1 transitions from the logic high level to a logic low level. At time tm2 after the data delaying time TMD has elapsed from time tm1, the second data M2 transitions from the logic high level to the logic low level. At time tc1, the first clock signal CK1 has a rising edge. At time tc2 after the clock delaying time TCD has elapsed from time tc1, the second clock signal CK2 has the rising edge. Since the first data M1 and the second data M2 are different during a period from time tm1 to time tm2, the first data M1 is not stored into the first latch 210. Thus, data in the first latch 210 is not changed and is maintained.

At time tc2 at which the first and second data M1 and M2 have the logic low level and the second clock signal CK2 has the rising edge, data "0" corresponding to the logic low level is stored into the first latch 210.

Referring to FIGS. 3 and 5B, at time tm3, a SET occurs on the first data M1. Then, a voltage level of the first data M1 temporarily varies. At time tm4 after the data delaying time TMD has elapsed from time tm3, the SET occurs on the second data M2. Then, a voltage level of the second data M2 temporarily varies. At time tc3, the first clock signal CK1 has a rising edge. At time tc4 after the clock delaying time TCD has elapsed from time tc3, the second clock signal CK2 has the rising edge. Since the first data M1 and the second data M2 are different during a period from time tm3 to time t1, the first data M1 is not stored into the first latch 210.

At time t1, the first and second data M1 and M2 have a logic low level. Thus, data "0" corresponding to the logic low level is stored into the first latch 210. At time tc4 at which the second clock signal CK2 has the rising edge, the first data M1 and the second data M2 are different. Thus, the first data M1 is not stored into the first latch 210.

Referring to FIGS. 3 and 5C, at time tm5, a SET occurs on the first data M1. At time tm6 after the data delaying time TMD has elapsed from time tm5, the SET occurs on the second data M2. At time tc5, the first clock signal CK1 has a rising edge. At time tc6 after the clock delaying time TCD has elapsed from time tc5, the second clock signal CK2 has the rising edge. Since the first data M1 and the second data M2 are different during a period from time tm5 to time t2, the first data M1 is not stored into the first latch 210. At time t2, the first and second data M1 and M2 have a logic low level.

Thus, data "0" corresponding to the logic low level is stored into the first latch 210. At time tc5 at which the first clock signal CK1 has the rising edge, the first data M1 and the second data M2 are different. Thus, the first data M1 is not stored into the first latch 210. At time tc6 at which the second clock signal CK2 has the rising edge, the first data M1 and the second data M2 are substantially the same. Thus, data "0" is stored into the first latch 210.

Figure 6A:
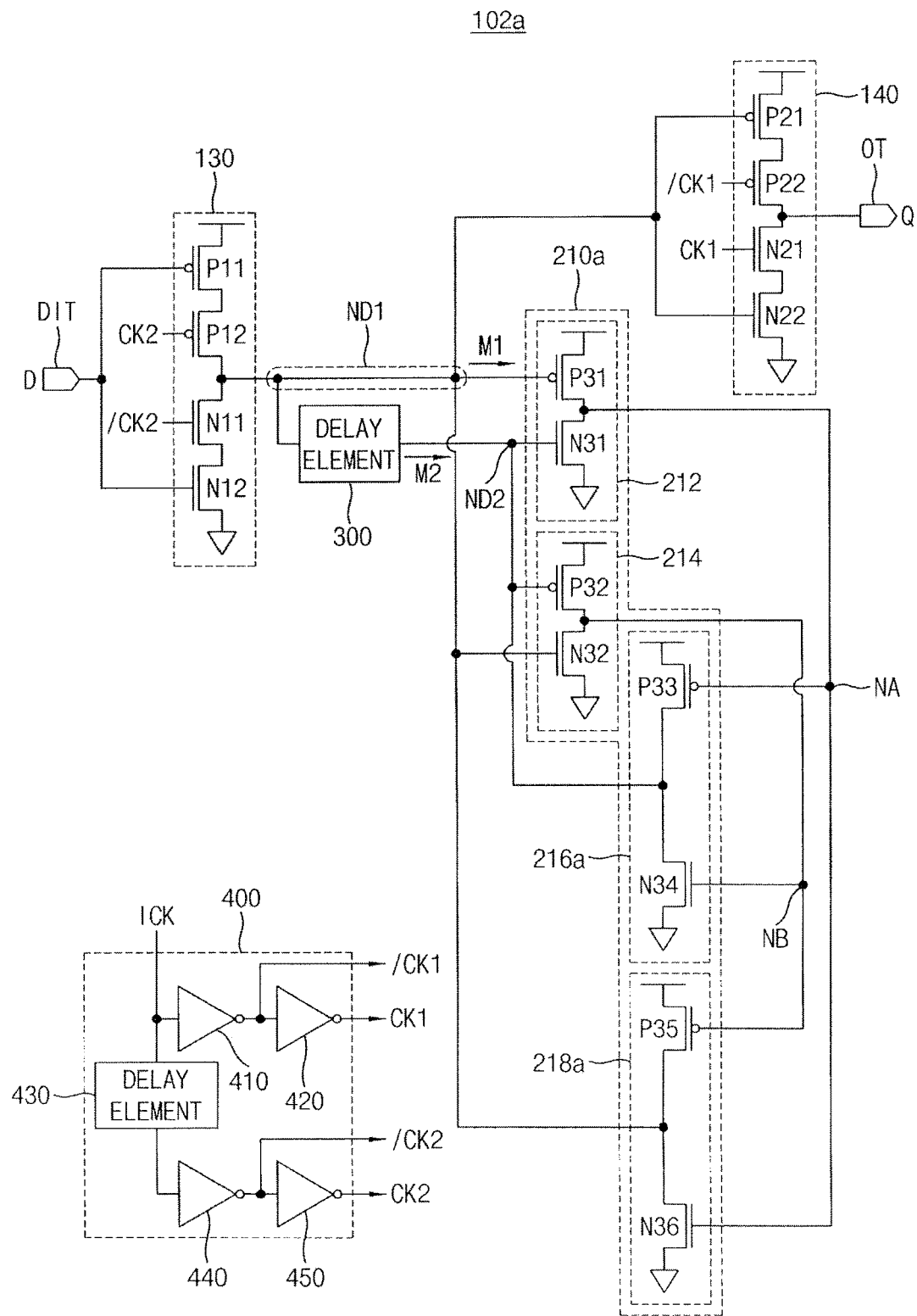
FIGS. 6A, 6B, 7A, and 7B illustrate other embodiments of a sequential circuit.

FIGS. 6A, 6B, 7A, and 7B illustrate other embodiments of the sequential circuit 100 of FIG. 1. Referring to FIG. 6A, a sequential circuit 102a may include the data input terminal DIT, the data output terminal OT, logic gates 130 and 140, a first latch 210a, the delay element 300, and the clock generator 400. The sequential circuit 102a may be substantially the same as the sequential circuit 100a of FIG. 3, except that the first latch 210 in FIG. 3 is replaced with the first latch 210a in FIG. 6A.

The first latch 210a may include a first logic gate 212, a second logic gate 214, a third logic gate 216a, and a fourth logic gate 218a. The first and second logic gates 212 and 214 in FIG. 6A may be substantially the same as the first and second logic gates 212 and 214 in FIG. 3, respectively. Each of the third and fourth logic gates 216a and 218a may be implemented with a two-input inverter, not a two-input gated inverter. Thus, the third and fourth logic gates 216a and 218a may operate without the second clock signal CK2, and the transistors P34, N33, P36 and N35 in FIG. 3 may be omitted in FIG. 6A.

Figure 6B:
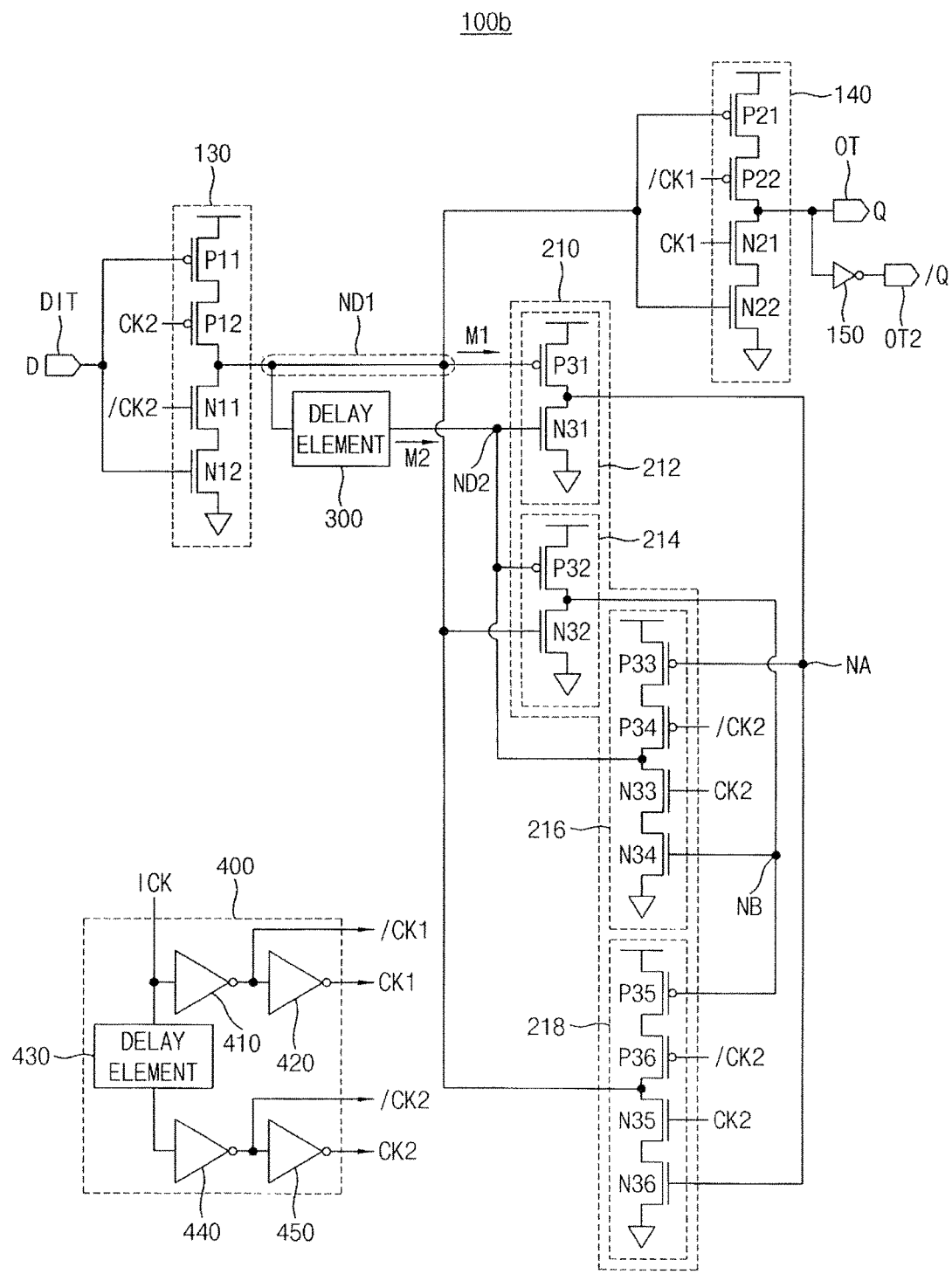

Referring to FIG. 6B, a sequential circuit 100b may include the data input terminal DIT, the data output terminal OT, logic gates 130 and 140, a first latch 210, the delay element 300, the clock generator 400, an inverter 150, and a second data output terminal OT2. The sequential circuit 100b of FIG. 6B may be substantially the same as the sequential circuit 100a of FIG. 3, except that the sequential circuit 100b of FIG. 6B further includes the inverter 150 and the second data output terminal OT2. An input terminal of the inverter 150 may be connected to the data output terminal OT. An output terminal of the inverter 150 may be connected to the second data output terminal OT2. The second data output terminal OT2 may provide inverted output data /Q that is inversion data of the output data Q.

Figure 7A:
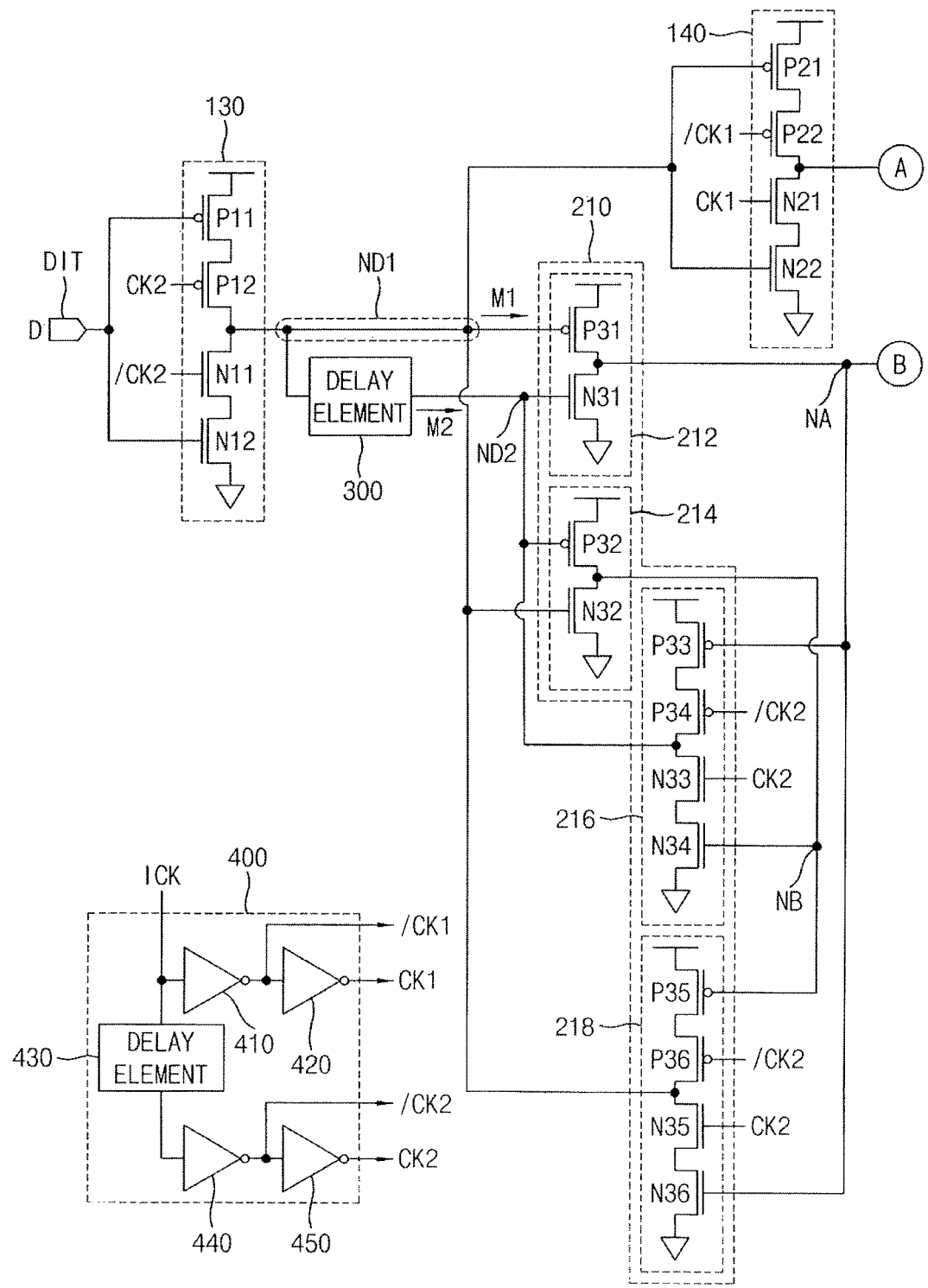
Figure 7B:
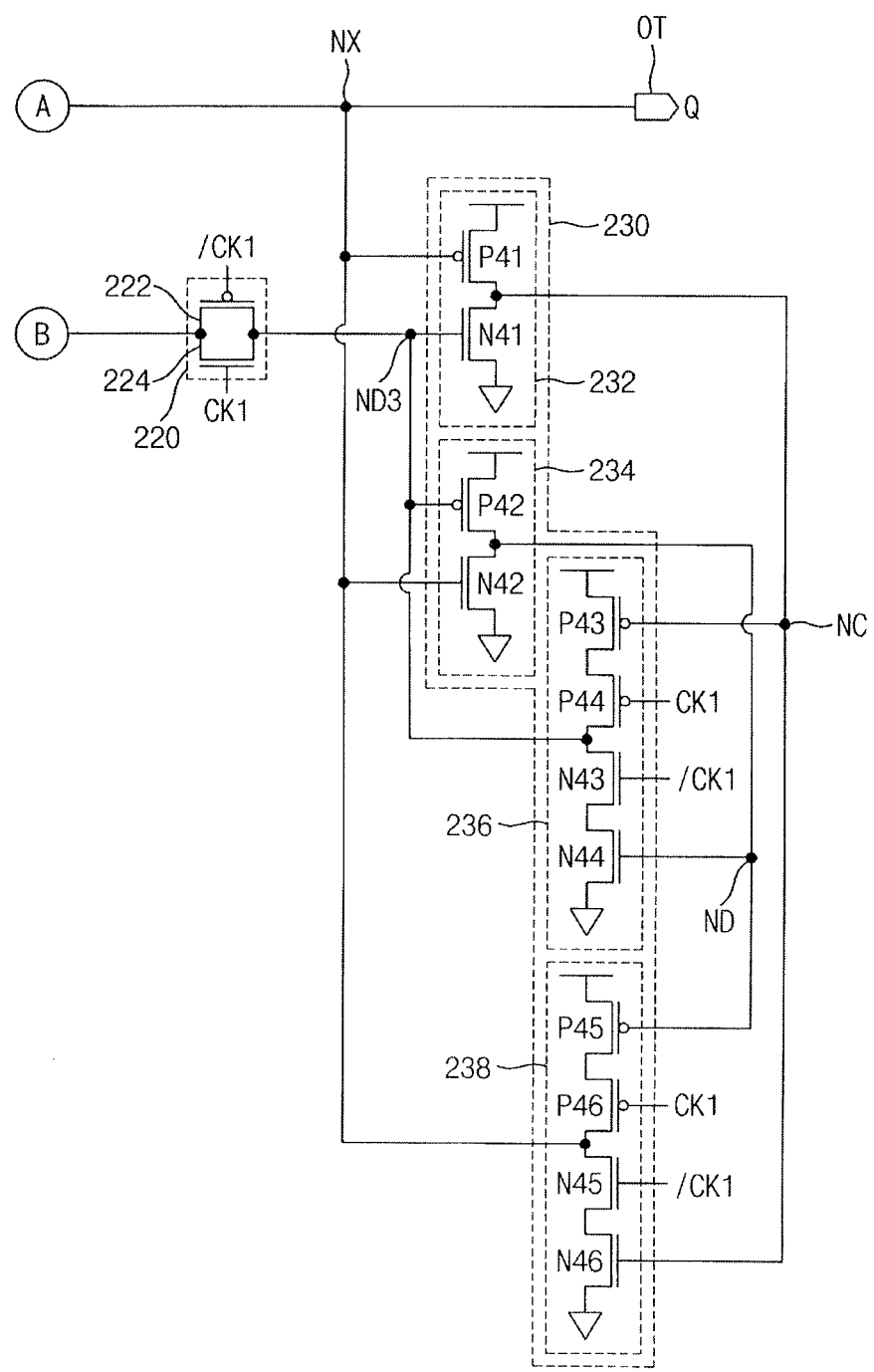

Referring to FIGS. 7A and 7B, a sequential circuit 100c may include the data input terminal DIT, the data output terminal OT, logic gates 130 and 140, a first latch 210, the delay element 300, the clock generator 400, a transfer gate 220, and a second latch 230. The sequential circuit 100c of FIGS. 7A and 7B may be substantially the same as the sequential circuit 100a of FIG. 3, except that the sequential circuit 100c of FIGS. 7A and 7B further includes the transfer gate 220 and the second latch 230.

The first latch 210, the transfer gate 220, and the second latch 230 in FIGS. 7A and 7B may correspond to the redundant feedback loop 200 in FIG. 1. For example, the redundant feedback loop may include two latches 210 and 230. The first latch 210 may operate as a master latch, and the second latch 230 may operate as a slave latch. The sequential circuit 100c with a redundant feedback loop includes two latches 210 and 230 may be referred to as a flip-flop circuit.

The transfer gate 220 may electrically connect an output terminal (e.g., the first node NA) of the first latch 210 with a third data node ND3 based on the first clock signal CK1. The transfer gate 220 may include a PMOS transistor 222 and a NMOS transistor 224 connected in parallel between the first node NA and the third data node ND3. The PMOS transistor 222 may have a gate electrode receiving the inverted first clock signal /CK1. The NMOS transistor 224 may have a gate electrode receiving the first clock signal CK1.

The second latch 230 may be connected to the data output terminal OT (e.g., a node NX between the logic gate 140 and the data output terminal OT) and the third data node ND3. The second latch 230 may store the first data M1 based on the first clock signal CK1 when the first data M1 is substantially the same as the second data M2. The second latch 230 may have a configuration substantially the same as the first latch 210.

The second latch 230 may include a fifth logic gate 232, a sixth logic gate 234, a seventh logic gate 236, and an eighth logic gate 238. The fifth logic gate 232 may have a first input terminal connected to the data output terminal OT, a second input terminal connected to the third data node ND3, and an output terminal connected to a third node NC. The fifth logic gate 232 may include a PMOS transistor P41 connected between the power supply voltage and the third node NC, and a NMOS transistor N41 connected between the third node NC and the ground voltage. The PMOS transistor P41 may have a gate electrode connected to the data output terminal OT. The NMOS transistor N41 may have a gate electrode connected to the third data node ND3.

The sixth logic gate 234 may have a first input terminal connected to the third data node ND3, a second input terminal connected to the data output terminal OT, and an output terminal connected to a fourth node ND. The sixth logic gate 234 may include a PMOS transistor P42 connected between the power supply voltage and the fourth node ND, and a NMOS transistor N42 connected between the fourth node ND and the ground voltage. The PMOS transistor P42 may have a gate electrode connected to the third data node ND3. The NMOS transistor N42 may have a gate electrode connected to the data output terminal OT.

The seventh logic gate 236 may have a first input terminal connected to the third node NC, a second input terminal connected to the fourth node ND, and an output terminal connected to the third data node ND3. The seventh logic gate 236 may operate based on the first clock signal CK1. The seventh logic gate 236 may include PMOS transistors P43 and P44 connected in series between the power supply voltage and the third data node ND3, and NMOS transistors N43 and N44 connected in series between the third data node ND3 and the ground voltage. The PMOS transistor P43 may have a gate electrode connected to the third node NC. The PMOS transistor P44 may have a gate electrode to receive the first clock signal CK1. The NMOS transistor N43 may have a gate electrode to receive the inverted first clock signal /CK1. The NMOS transistor N44 may have a gate electrode connected to the fourth node ND.

The eighth logic gate 238 may have a first input terminal connected to the fourth node ND, a second input terminal connected to the third node NC, and an output terminal connected to the data output terminal OT. The eighth logic gate 238 may operate based on the first clock signal CK1. The eighth logic gate 238 may include PMOS transistors P45 and P46 connected in series between the power supply voltage and the data output terminal OT, and NMOS transistors N45 and N46 connected in series between the data output terminal OT and the ground voltage. The PMOS transistor P45 may have a gate electrode connected to the fourth node ND. The PMOS transistor P46 may have a gate electrode to receive the first clock signal CK1. The NMOS transistor N45 may have a gate electrode to receive the inverted first clock signal /CK1. The NMOS transistor N46 may have a gate electrode connected to the third node NC.

According to example embodiments, the sequential circuit 100c of FIGS. 7A and 7B may further include the inverter 150 and the second data output terminal OT2 as in FIG. 6B. According to example embodiments, in each of the sequential circuit 100b of FIG. 6B and the sequential circuit 100c of FIGS. 7A and 7B, the first latch 210 may be replaced with the first latch 210a in FIG. 6A. Then, the second latch 230 in FIGS. 7A and 7B may be changed to have a configuration substantially the same as the first latch 210a in FIG. 6A.

Figure 8:
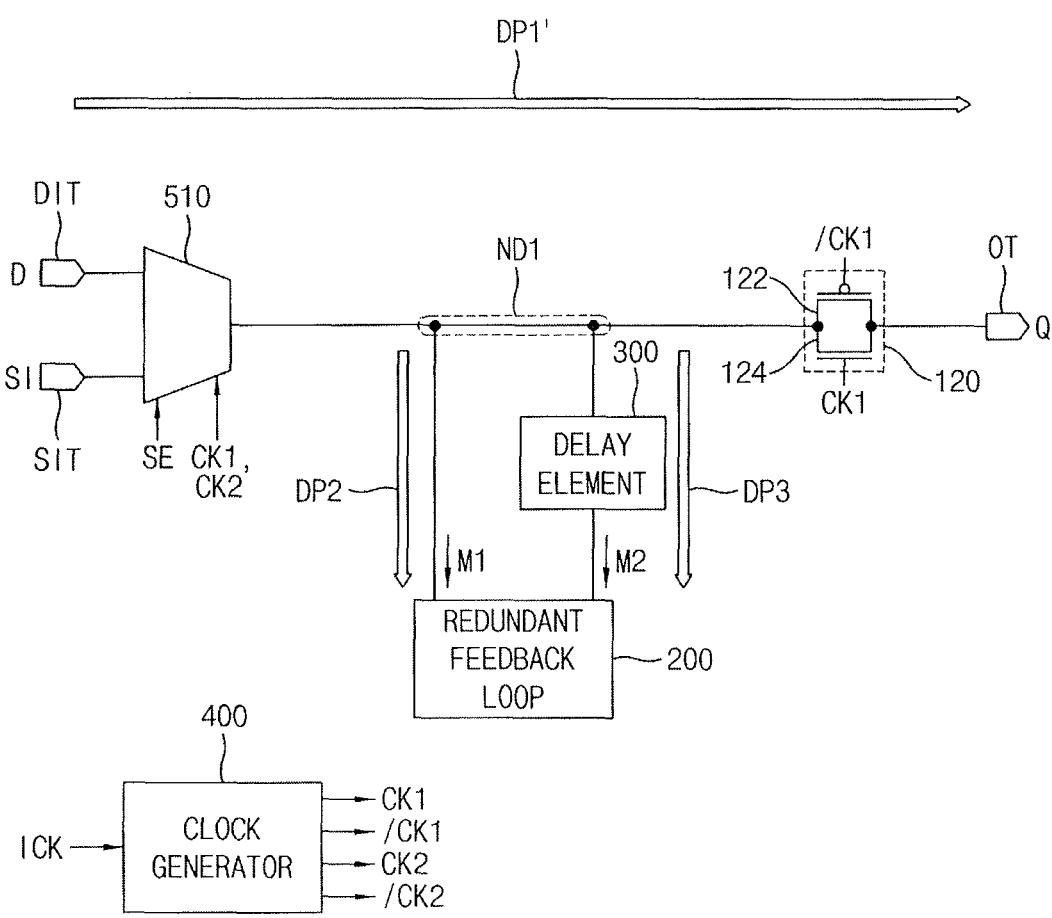
FIG. 8 illustrates another embodiment of a sequential circuit.

FIG. 8 illustrates another embodiment of a sequential circuit 500 which includes a data input terminal DIT, a first data path DP1', and a redundant feedback loop 200. The sequential circuit 500 may further include a data output terminal OT, a second data path DP2, a third data path DP3, a clock generator 400, a scan input terminal SIT, and a multiplexer 510. The sequential circuit 500 may be substantially the same as the sequential circuit 100 of FIG. 1, except that the sequential circuit 500 further includes the scan input terminal SIT and the multiplexer 510. Compared to the sequential circuit 100 of FIG. 1, the sequential circuit 500 may further have a scan function. The transfer gate 110 in FIG. 1 may be in the multiplexer 510 in FIG. 8.

The scan input terminal SIT may receive scan input data SI. For example, the scan input data SI may represent a test pattern for testing an integrated circuit including the sequential circuit 500.

The multiplexer 510 may provide one of the input data D or the scan input data SI to the first data path DP1' based on a scan enable signal SE and the first and second clock signals CK1 and CK2. Thus, the first data path DP1' may transmit one of the input data D or the scan input data SI to the data output terminal OT. The first data M1 may correspond to one of the input data D or the scan input data SI.

Figure 9:
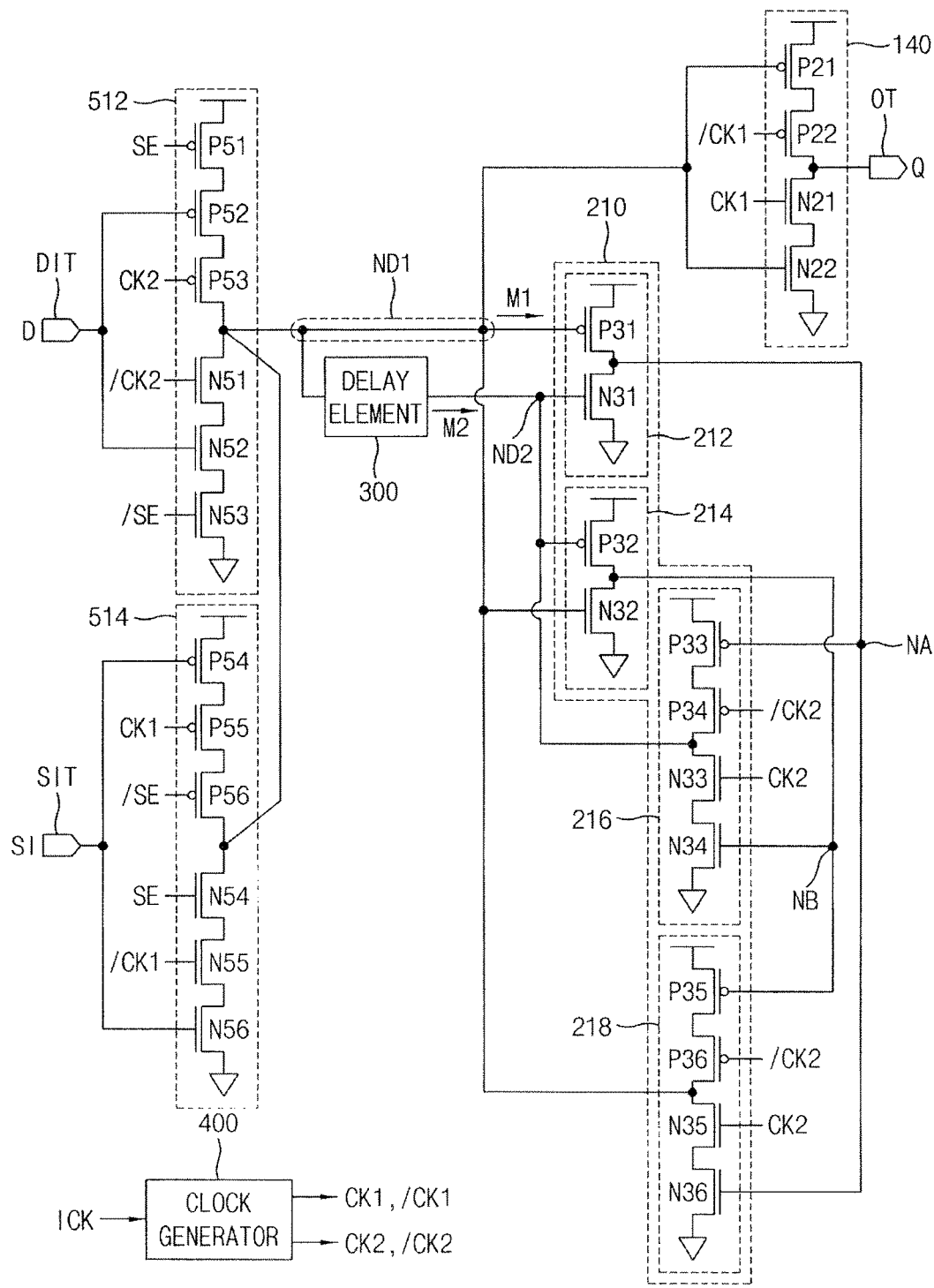
FIGS. 9, 10A, and 10B illustrate other circuit embodiments of a sequential circuit.
Figure 10A:
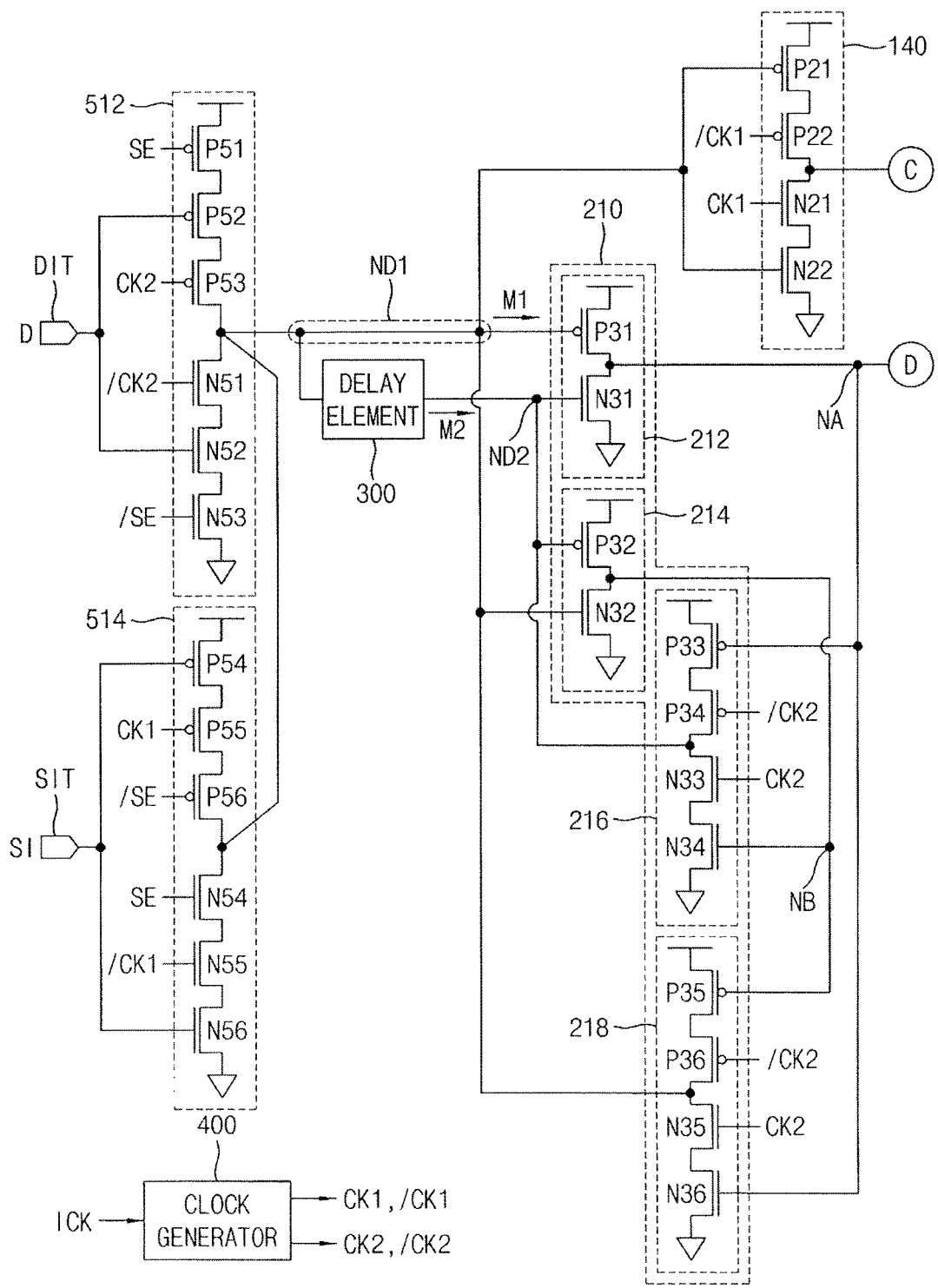
Figure 10B:
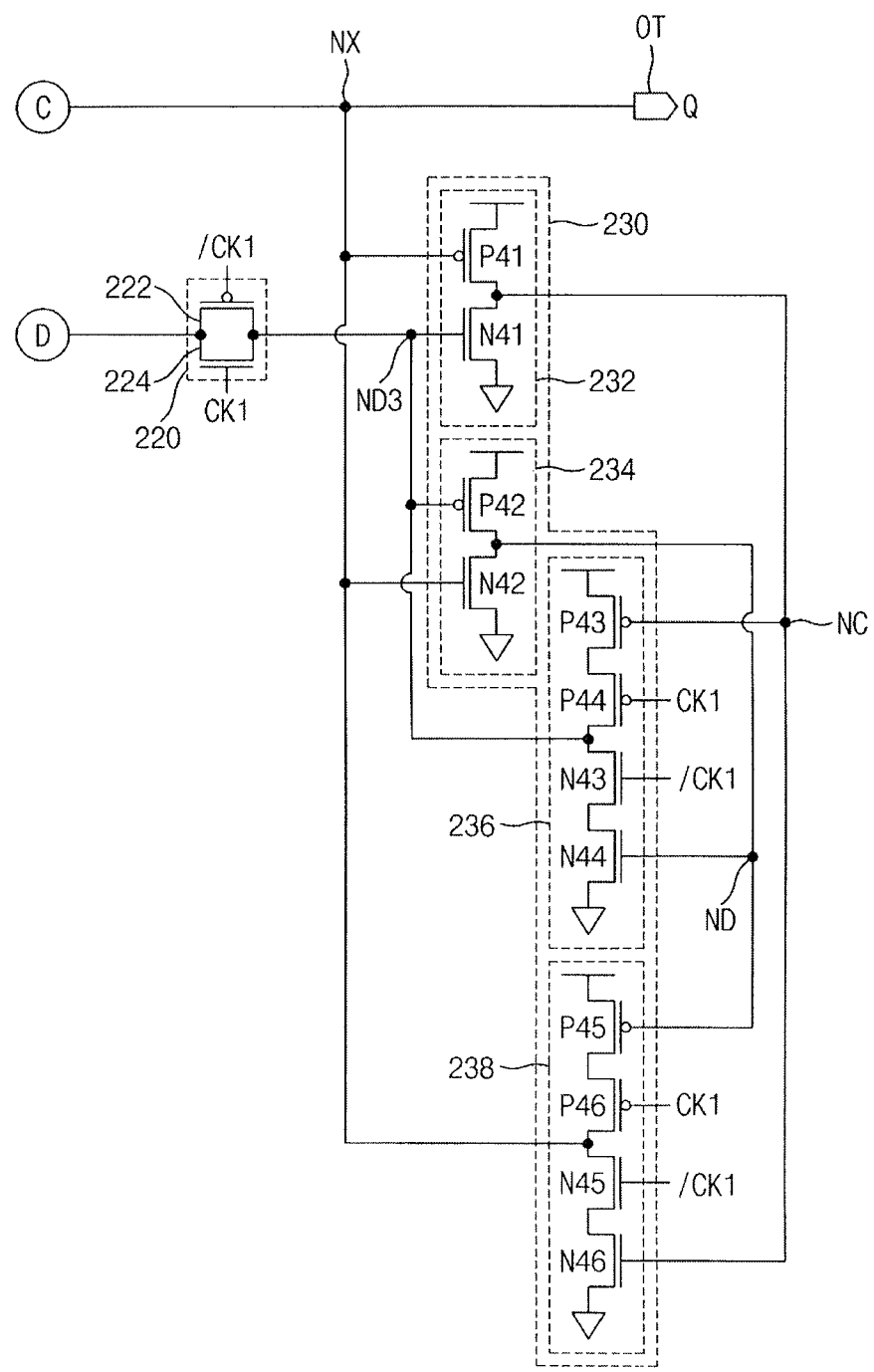

FIGS. 9, 10A, and 10B illustrate circuit embodiments of the sequential circuit 500 in FIG. 8. Referring to FIG. 9, a sequential circuit 500a may include the data input terminal DIT, the data output terminal OT, logic gates 512, 514 and 140, a first latch 210, the delay element 300, and the clock generator 400. The sequential circuit 500a may be substantially the same as the sequential circuit 100a in FIG. 3, except that the one logic gate 130 in FIG. 3 is replaced with the two logic gates 512 and 514 in FIG. 9.

The logic gates 512 and 514 may correspond to the multiplexer 510 in FIG. 8. For example, the multiplexer may include two logic gates 512 and 514. The sequential circuit 500a in FIG. 9, in which the redundant feedback loop includes one latch 210 and has the scan function, may be referred to as a scan latch circuit.

The logic gate 512 may provide the input data D to the first data path DP1' in FIG. 8 based on the second clock signal CK2 when the scan enable signal SE has a first logic level (e.g., a logic low level). The logic gate 512 may include PMOS transistors P51, P52 and P53 connected in series between the power supply voltage and the first data node ND1, and NMOS transistors N51, N52 and N53 connected in series between the first data node ND1 and the ground voltage. The PMOS transistor P51 may have a gate electrode to receive the scan enable signal SE. The PMOS transistor P52 may have a gate electrode connected to the data input terminal DIT. The PMOS transistor P53 may have a gate electrode to receive the second clock signal CK2. The NMOS transistor N51 may have a gate electrode to receive the inverted second clock signal /CK2. The NMOS transistor N52 may have a gate electrode connected to the data input terminal DIT. The NMOS transistor N53 may have a gate electrode to receive an inverted scan enable signal /SE that is an inversion signal of the scan enable signal SE.

The logic gate 514 may provide the scan input data SI to the first data path DP1' in FIG. 8 based on the first clock signal CK1 when the scan enable signal SE has a second logic level (e.g., a logic high level). The logic gate 514 may include PMOS transistors P54, P55 and P56 connected in series between the power supply voltage and the first data node ND1 and NMOS transistors N54, N55 and N56 connected in series between the first data node ND1 and the ground voltage. The PMOS transistor P54 may have a gate electrode connected to the scan input terminal SIT. The PMOS transistor P55 may have a gate electrode to receive the first clock signal CK1. The PMOS transistor P56 may have a gate electrode to receive the inverted scan enable signal /SE. The NMOS transistor N54 may have a gate electrode to receive the scan enable signal SE. The NMOS transistor N55 may have a gate electrode to receive the inverted first clock signal /CK1. The NMOS transistor N56 may have a gate electrode connected to the scan input terminal SIT.

The order of arrangement of the PMOS transistors P51, P52 and P53 between the power supply voltage and the first data node ND1 may be different in another embodiment. The order of arrangement of the transistors N51, N52, N53, P54, P55, P56, N54, N55 and N56 may also be different in another embodiment.

In a scan chain circuit including a plurality of sequential circuits, the delaying time between two adjacent sequential circuits may be relatively short. Thus, to prevent a violation of racing in the scan chain circuit when the scan function is performed, the scan input data SI may be provided to the first data path DP1' based on a normal clock signal (e.g., CK1), not a delayed clock signal (e.g., CK2). To prevent malfunction due to a SET when data is normally transferred or transmitted without the scan function, the input data D may be provided to the first data path DP1' based on delayed clock signal (e.g., CK2).

Referring to FIGS. 10A and 10B, a sequential circuit 500b may include the data input terminal DIT, the data output terminal OT, logic gates 512, 514 and 140, a first latch 210, the delay element 300, the clock generator 400, a transfer gate 220, and a second latch 230. The sequential circuit 500b of FIGS. 10A and 10B may be substantially the same as the sequential circuit 100c of FIGS. 7A and 7B, except that the one logic gate 130 in FIGS. 7A and 7B is replaced with the two logic gates 512 and 514 in FIGS. 10A and 10B. The logic gates 512 and 514 in FIGS. 10A and 10B may be substantially the same as the logic gates 512 and 514 in FIG. 9, respectively. The sequential circuit 500b of FIGS. 10A and 10B, in which the redundant feedback loop includes two latches 210 and 230 and has the scan function, may be referred to as a scan flip-flop circuit.

According to example embodiments, each of the sequential circuit 500a of FIG. 9 and the sequential circuit 500b of FIGS. 10A and 10B may further include the inverter 150 and the second data output terminal OT2 as in FIG. 6B. According to example embodiments, in each of the sequential circuit 500a of FIG. 9 and the sequential circuit 500b of FIGS. 10A and 10B, an output terminal for providing output data corresponding to the input data D may be separated from an output terminal for providing scan output data corresponding to the scan input data SI. According to example embodiments, in each of the sequential circuit 500a of FIG. 9 and sequential circuit 500b of FIGS. 10A and 10B, the first latch 210 may be replaced with the first latch 210a in FIG. 6A. Then, the second latch 230 in FIGS. 10A and 10B may be changed to have a configuration substantially the same as the first latch 210a in FIG. 6A.

Figure 11:
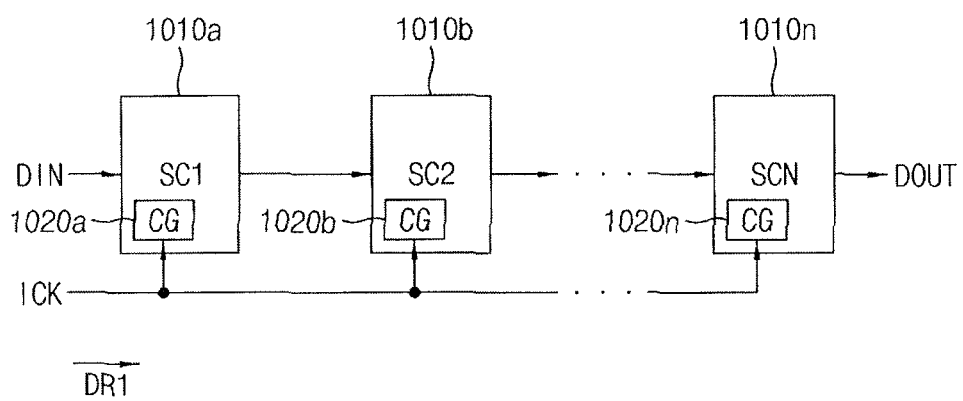
FIGS. 11 to 13 illustrate embodiments of a scan chain circuit.
Figure 12:
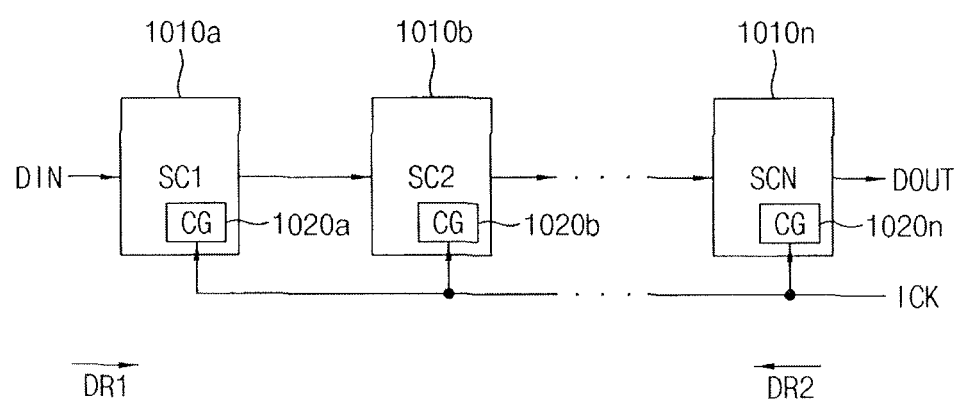
Figure 13:
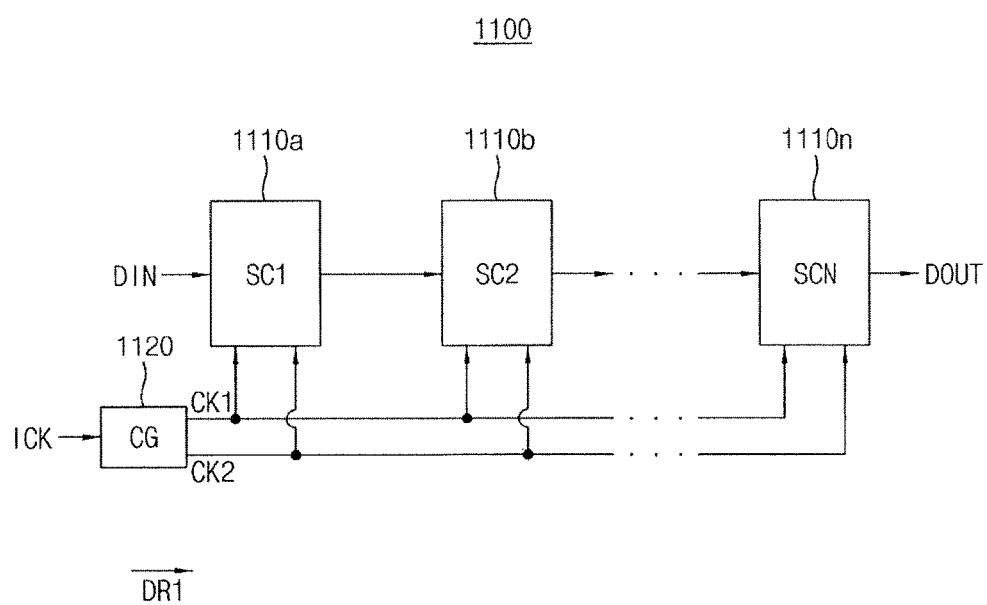

FIGS. 11, 12, and 13 illustrate embodiments of the scan chain circuit.

Referring to FIG. 11, a scan chain circuit 1000a includes first through N-th sequential circuits 1010a, 1010b, . . . , 1010n, where N is a natural number equal to or greater than two. The first through N-th sequential circuits 1010a~1010n are connected in series to sequentially transfer input data DIN based on an input clock signal ICK. Data output from a previous sequential circuit may be input to a current sequential circuit. Data output from the current sequential circuit may be input to a next sequential circuit. For example, the first sequential circuit 1010a may receive the input data DIN. The second sequential circuit 1010b may receive data output from the first sequential circuit 1010a. The N-th sequential circuit 1010n may receive data output from a (N−1)-th sequential circuit and may provide output data DOUT to a circuit external to the scan chain circuit 1000a.

In one embodiment, each of the first through N-th sequential circuits 1010a~1010n may be a sequential circuit. For example, the first sequential circuit 1010a may include a data input terminal, a first data path, and a redundant feedback loop. The data input terminal may receive the input data DIN. The first data path may be connected to the data input terminal and may transmit the input data DIN to a data output terminal based on a first clock signal (that corresponds to the input clock signal ICK) and a second clock signal that is a delayed signal of the first clock signal.

The redundant feedback loop may be connected to the first data path and may store first data based on at least one of the first or second clock signals when the first data that corresponds to the input data DIN is substantially the same as second data that is delayed data of the first data. Each of the first through N-th sequential circuits 1010a~1010n may operate based on the first and second clock signals having different timings and may store data into the redundant feedback loop only when the first and second data having different timings are substantially the same as each other. Each of the first through N-th sequential circuits 1010a~1010n may include the first data path that directly connects the data input terminal with the data output terminal without any delay element. As a result, a relatively robust characteristic for the SET may be achieved without degrading performance.

In some example embodiments, each of the first through N-th sequential circuits 1010a~1010n may include a respective one of clock generators 1020a, 1020b, . . . , 1020n. For example, the first sequential circuit 1010a may include the clock generator 1020a. Each of the clock generators 1020a~1020n may be substantially the same as the clock generator 400 in FIGS. 1, 3, and other example figures. For example, each of the clock generators 1020a~1020n may generate the first clock signal and the inverted first clock signal /CK1 based on the input clock signal ICK, and may generate the second clock signal CK2 and inverted second clock signal /CK2 by delaying input clock signal ICK.

In the scan chain circuit 1000a of FIG. 11, the propagation direction of the input data DIN (e.g., a data propagation direction) may be substantially the same as the propagation direction of the input clock signal ICK (e.g., a clock propagation direction). For example, in the first through N-th sequential circuits 1010a~1010n, the input data DIN may be transferred in a first direction DR1 from the first sequential circuit 1010a to the N-th sequential circuit 1010n. The input clock signal ICK may be applied to the first through N-th sequential circuits 1010a~1010n in the first direction DR1.

When the input data DIN is transferred in the first direction DR1 from the first sequential circuit 1010a to the N-th sequential circuit 1010n, the input data DIN may be input to the first sequential circuit 1010a, sequentially shifted by the first through N-th sequential circuits 1010a~1010n, and output from the N-th sequential circuit 1010n. When the input clock signal ICK is applied to the first through N-th sequential circuits 1010a~1010n in the first direction DR1, the input clock signal ICK may be sequentially applied first to first sequential circuit 1010a and last to the N-th sequential circuit 1010n, so that the input clock signal ICK is applied to the current sequential circuit. The input clock signal ICK may then be applied to the next sequential circuit (e.g., the next or subsequent sequential circuit relative to the current sequential circuit based on the data propagation direction).

Referring to FIG. 12, a scan chain circuit 1000b includes first through N-th sequential circuits 1010a~1010n. The scan chain circuit 1000b of FIG. 12 may be substantially the same as the scan chain circuit 1000a of FIG. 11, except that the propagation direction of the input clock signal ICK is changed in the scan chain circuit 1000b of FIG. 12.

In the scan chain circuit 1000b of FIG. 12, the propagation direction of the input data DIN and the propagation direction of the input clock signal ICK may be different. For example, in the first through N-th sequential circuits 1010a~1010n, the input clock signal ICK may be applied to the first through N-th sequential circuits 1010a~1010n in a second direction DR2 opposite to the first direction DR1 from the N-th sequential circuit 1010n to the first sequential circuit 1010a. When the input clock signal ICK is applied to the first through N-th sequential circuits 1010a~1010n in the second direction DR2 from the N-th sequential circuit 1010n to the first sequential circuit 1010a, the input clock signal ICK is sequentially applied first to the N-th sequential circuit 1010n and last to the first sequential circuit 1010a, so that the input clock signal ICK is applied to the current sequential circuit. The input clock signal ICK may then be applied to the previous sequential circuit (e.g., the sequential circuit previous to the current sequential circuit based on the data propagation direction).

Referring to FIG. 13, a scan chain circuit 1100 includes first through N-th sequential circuits 1110a, 1110b, . . . , 1110n and a clock generator 1120. The first through N-th sequential circuits 1110a~1110n are connected in series to sequentially transfer input data DIN based on an input clock signal ICK. The N-th sequential circuit 1110n may provide output data DOUT to a circuit external to the scan chain circuit 1100. Each of the first through N-th sequential circuits 1110a~1110n may be a sequential circuit according to example embodiments, except that each of the first through N-th sequential circuits 1110a~1110n does not include a clock generator.

The clock generator 1120 may be located outside the first through N-th sequential circuits 1110a~1110n. The clock generator 1120 may be substantially the same as the clock generator 400 in FIGS. 1, 3, and other example figures. For example, the clock generator 1120 may generate the first clock signal CK1 and the inverted first clock signal /CK1 based on the input clock signal ICK and the second clock signal CK2 and the inverted second clock signal /CK2 by delaying the input clock signal ICK. Thus, the clock generator 1120 may be shared by the first through N-th sequential circuits 1110a~1110n.

In the scan chain circuit 1100 of FIG. 13, the propagation direction of the input data DIN may be substantially the same as the propagation direction of the first and second clock signals CK1 and CK2. The propagation direction of the input data DIN and the propagation direction of the first and second clock signals CK1 and CK2 may be different, for example, as in FIG. 12.

Figure 14:
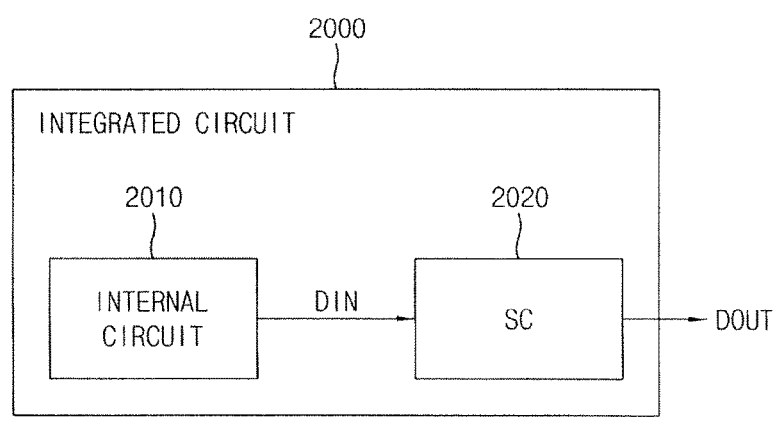
FIGS. 14 to 16 illustrate embodiments of an integrated circuit.
Figure 15:
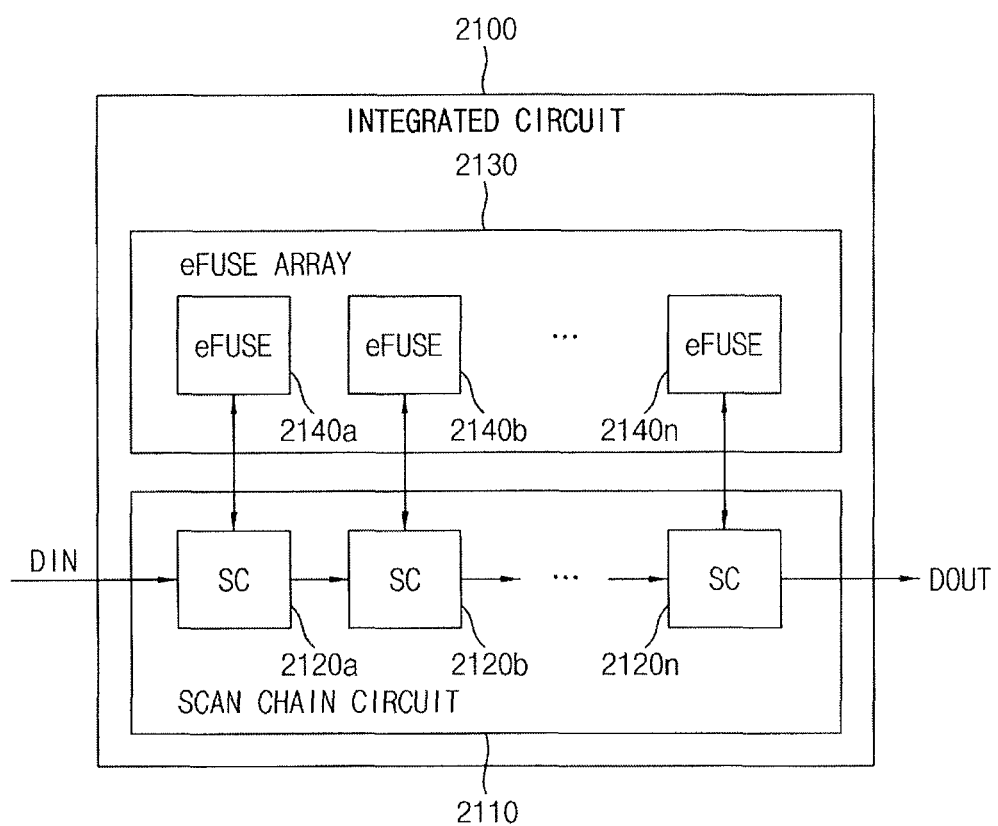
Figure 16:
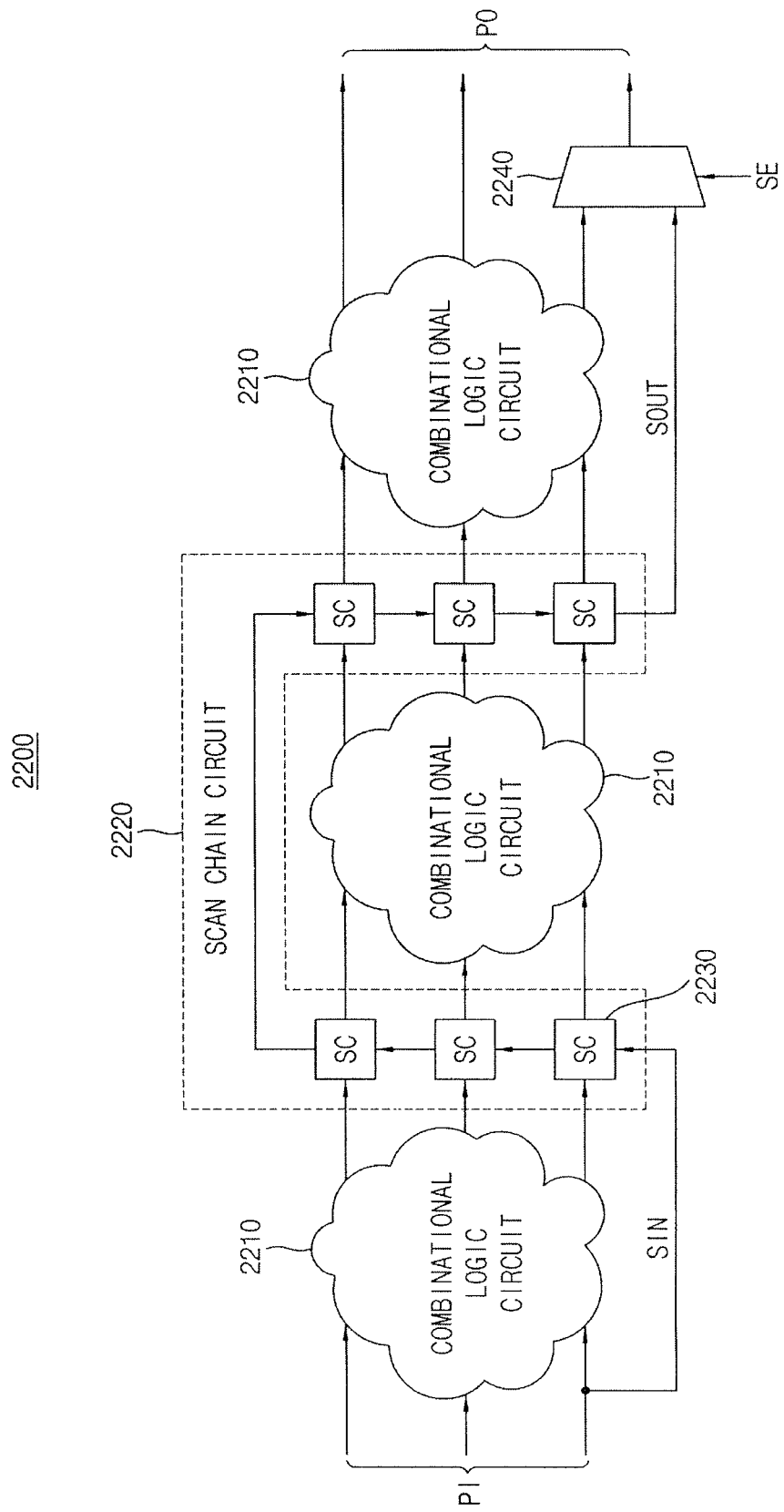

FIGS. 14, 15 and 16 illustrate embodiments of an integrated circuit.

Referring to FIG. 14, an integrated circuit 2000 may include an internal circuit 2010 and a sequential circuit 2020. In some example embodiments, the integrated circuit 2000 may be an application processor (AP), a microprocessor, a central processing unit (CPU), an application-specific integrated circuit (ASIC), a mobile system-on-chip (SOC), a multimedia SOC, a smart card, or the like. The internal circuit 2010 may perform various computational functions such as particular calculations and tasks and may generate data DIN as a result of various computational functions. The sequential circuit 2020 may receive the data DIN as input data, and may provide data DOUT corresponding to the data DIN to a circuit external to the integrated circuit 2000. The sequential circuit 2020 may be a sequential circuit according to example embodiments.

Referring to FIG. 15, an integrated circuit 2100 may include a scan chain circuit 2110 and an electrical fuse array 2130. The scan chain circuit 2110 may include a plurality of sequential circuits 2120a, 2120b, . . . , 2120n connected in series. Each of the sequential circuits 2120a~2120n may be a sequential circuit according to embodiments.

The electrical fuse array 2130 may include a plurality of electrical fuse elements 2140a, 2140b, . . . , 2140n. In some example embodiment, the electrical fuse elements 2140a~2140n may be electrically programmed or blown using the scan chain circuit 2110. For example, input data DIN to be programmed to the electrical fuse elements 2140a~2140n in the electrical fuse array 2130 may be sequentially applied and stored into the scan chain circuit 2110. The electrical fuse elements 2140a~2140n in the electrical fuse array 2130 may be cut or uncut based on the input data DIN stored in the sequential circuits 2120a~2120n in the scan chain circuit 2110, respectively. As described above, the scan chain circuit 2110 may be used in programming the electrical fuse array 2130.

In other example embodiment, data stored in the electrical fuse array 2130 may be sensed using the scan chain circuit 2110. For example, data stored in the electrical fuse elements 2140a~2140n of the electrical fuse array 2130 may be read by the sequential circuits 2120a~2120n of the scan chain circuit 2110. The data read by the sequential circuits 2120a~2120n may be provided as output data DOUT of the scan chain circuit 2110. As described above, the scan chain circuit 2110 may be used in sensing the electrical fuse array 2130. For example, the data stored in the electrical fuse array 2130 may be an electronic chip ID (ECID) of the integrated circuit 2100.

Referring to FIG. 16, an integrated circuit 2200 may include a combinational logic circuit 2210, a scan chain circuit 2220 and a multiplexer 2240. The combinational logic circuit 2210 may perform various logic operations on data. The scan chain circuit 2220 may include a plurality of sequential circuits 2230 connected in series. Each of the sequential circuits 2230 may be a sequential circuit according to example embodiments.

In some example embodiment, the integrated circuit 2200 may include a scan chain circuit 2220 including sequential circuits 2230 connected in series as a design-for-test (DFT) circuit to facilitate an efficient test of integrated circuit 2200. For example, a scan test for integrated circuit 2200 is performed using the scan chain circuit 2220.

For example, a shift-in operation may be performed to sequentially input a predetermined test pattern as a scan input SIN to the scan chain circuit 2220 through one or more of primary inputs PI of the integrated circuit 2000. Further, a capture operation may be performed so that the test pattern loaded into the scan chain circuit 2220 is provided to the combinational logic circuit 2210 to generate observed values based on the test pattern. The observed values of the combinational logic circuit 2210 may be stored in the scan chain circuit 2220.

A shift-out operation may be performed to sequentially output the observed values stored in the scan chain circuit 2220, as a scan output SOUT, through one or more primary outputs PO of the integrated circuit 2000. In some example embodiments, a plurality of similar or different test patterns may be used. In one case, the shift-out operation that outputs the observed values for one test pattern and the shift-in operation that inputs the next test pattern may be performed substantially at the same time. In other cases, the shift-out operation that outputs the observed values for one test pattern and the shift-in operation that inputs the next test pattern may be performed at different times. For example, the shift-out operation could be performed before the shift-in operation of the next test pattern. As another example, the shift-in operation of the next test pattern could be performed before the shift out operation.

Figure 17:
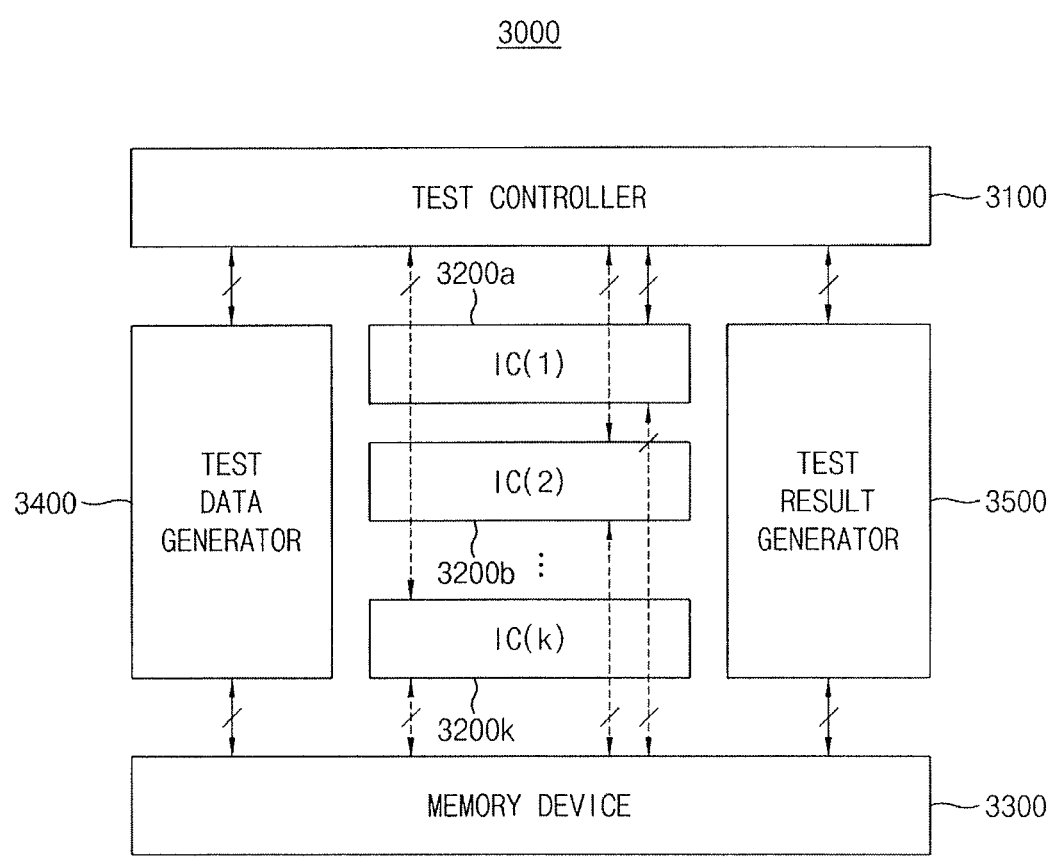
FIG. 17 illustrates an embodiment of an integrated circuit testing system.

FIG. 17 illustrates an embodiment of an integrated circuit testing system 3000 may include a test controller 1020, a plurality of integrated circuits 3200a, 3200b, . . . , 3200k, a memory device 3300, a test data generator 3400, and a test result generator 3500. Each of the integrated circuits 3200a~3200k may be an integrated circuit according to example embodiments and may include at least one sequential circuit according to example embodiments and/or at least one scan chain circuit according to example embodiments.

The test controller 1020 may control a scan test for each of the integrated circuits 3200a~3200k by controlling elements in the integrated circuit testing system 3000. The memory device 3300 may store data for the scan test. The test data generator 3400 may generate the test pattern applied to the integrated circuits 3200a~3200k. The test result generator 3500 may generate test results by comparing observed values output from the integrated circuits 3200a~3200k with a reference pattern.

The embodiments disclosed herein may be applied to various devices and systems that include the sequential circuit and/or the scan chain circuit. Examples include a mobile phone, a smart phone, a tablet computer, a laptop computer, a personal digital assistants (PDA), a portable multimedia player (PMP), a digital camera, a portable game console, a wearable system, an internet of things (IoT) system, a three-dimensional (3D) geometry reconstruction system, an array camera system, a virtual reality (VR) system, an augmented reality (AR) system, etc.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The signal generating and processing features of the embodiments disclosed herein may be implemented in logic which, for example, may include hardware, software, or both. When implemented at least partially in hardware, the signal generating and processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the signal generating and processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. A sequential circuit, comprising:
a data input terminal to receive input data;
a first data path, connected to the data input terminal, to transmit the input data to a data output terminal based on a first clock signal and a second clock signal; and
a redundant feedback loop, connected to the first data path, to store first data based on at least one of the first or second clock signals when the first data is equal to second data, wherein the first data corresponds to the input data, wherein the second clock signal is a delayed signal of the first clock signal, and wherein the second data is delayed data of the first data.

2. The sequential circuit as claimed in claim 1, wherein:
the redundant feedback loop includes a first latch connected to a first data node from which the first data is to be provided and a second data node from which the second data is to be provided,
the first latch to store the first data based on the second clock signal when the first data is the same as the second data, and
the first data node is on the first data path.

3. The sequential circuit as claimed in claim 2, wherein the first latch includes:
a first logic gate including a first input terminal connected to the first data node, a second input terminal connected to the second data node, and an output terminal connected to a first node;
a second logic gate including a first input terminal connected to the second data node, a second input terminal connected to the first data node, and an output terminal connected to a second node;
a third logic gate including a first input terminal connected to the first node, a second input terminal connected to the second node, and an output terminal connected to the second data node; and
a fourth logic gate including a first input terminal connected to the second node, a second input terminal connected to the first node, and an output terminal connected to the first data node.

4. The sequential circuit as claimed in claim 3, wherein:
the first logic gate includes a first p-type metal oxide semiconductor (PMOS) transistor connected between a power supply voltage and the first node,
the first PMOS transistor includes a gate electrode connected to the first data node,
a first n-type metal oxide semiconductor (NMOS) transistor is connected between the first node and a ground voltage, and
the first NMOS transistor includes a gate electrode connected to the second data node.

5. The sequential circuit as claimed in claim 3, wherein:
the third logic gate includes first and second PMOS transistors connected in series between a power supply voltage and the second data node; and
the first and second NMOS transistors are connected in series between the second data node and a ground voltage,
the first PMOS transistor has a gate electrode connected to the first node,
the second PMOS transistor has a gate electrode to receive an inversion signal of the second clock signal,
the first NMOS transistor has a gate electrode to receive the second clock signal, and
the second NMOS transistor has a gate electrode connected to the second node.

6. The sequential circuit as claimed in claim 3, wherein:
the third logic gate includes a first PMOS transistor connected between a power supply voltage and the second data node,
the first PMOS transistor has a gate electrode connected to the first node;
a first NMOS transistor is connected between the second data node and a ground voltage, and
the first NMOS transistor has a gate electrode connected to the second node.

7. The sequential circuit as claimed in claim 2, wherein the redundant feedback loop includes:
a transfer gate to electrically connect an output terminal of the first latch with a third data node based on the first clock signal; and
a second latch connected to the data output terminal and the third data node, the second latch to store the first data based on the first clock signal when the first data is equal to the second data.

8. The sequential circuit as claimed in claim 7, wherein the second latch includes:
a first logic gate including a first input terminal connected to the data output terminal, a second input terminal connected to the third data node, and an output terminal connected to a first node;
a second logic gate including a first input terminal connected to the third data node, a second input terminal connected to the data output terminal, and an output terminal connected to a second node;
a third logic gate including a first input terminal connected to the first node, a second input terminal connected to the second node, and an output terminal connected to the third data node; and
a fourth logic gate including a first input terminal connected to the second node, a second input terminal connected to the first node, and an output terminal connected to the data output terminal.

9. The sequential circuit as claimed in claim 1, further comprising:
a scan input terminal to receive scan input data; and
a multiplexer to provide one of the input data and the scan input data to the first data path based on a scan enable signal and the first and second clock signals, wherein the first data path is to transmit one of the input data or the scan input data to the data output terminal, and wherein the first data corresponds to one of the input data or the scan input data.

10. The sequential circuit as claimed in claim 9, wherein the multiplexer includes:
a first logic gate to provide the input data to the first data path based on the second clock signal when the scan enable signal has a first logic level; and
a second logic gate to provide the scan input data to the first data path based on the first clock signal when the scan enable signal has a second logic level.

11. The sequential circuit as claimed in claim 10, wherein the first logic gate includes:
first, second and third PMOS transistors connected in series between a power supply voltage and a first data node on the first data path; and first, second and third NMOS transistors connected in series between the first data node and a ground voltage,
wherein the first PMOS transistor has a gate electrode to receive the scan enable signal, the second PMOS transistor has a gate electrode connected to the data input terminal, the third PMOS transistor has a gate electrode to receive the second clock signal, the first NMOS transistor has a gate electrode to receive an inversion signal of the second clock signal, the second NMOS transistor has a gate electrode connected to the data input terminal, and the third NMOS transistor has a gate electrode to receive an inversion signal of the scan enable signal.

12. The sequential circuit as claimed in claim 10, wherein the second logic gate includes:
first, second and third PMOS transistors connected in series between a power supply voltage and a first data node on the first data path; and
first, second and third NMOS transistors connected in series between the first data node and a ground voltage,
wherein the first PMOS transistor has a gate electrode connected to the scan input terminal, the second PMOS transistor has a gate electrode to receive the first clock signal, the third PMOS transistor has a gate electrode to receive an inversion signal of the scan enable signal, the first NMOS transistor has a gate electrode to receive the scan enable signal, the second NMOS transistor has a gate electrode to receive an inversion signal of the first clock signal, and the third NMOS transistor has a gate electrode connected to the scan input terminal.

13. A scan chain circuit, comprising:
first through N-th sequential circuits connected in series to sequentially transfer input data based on an input clock signal, where N is a natural number equal to or greater than two, wherein the first sequential circuit includes:
a data input terminal to receive the input data;
a first data path, connected to the data input terminal, to transmit the input data to a data output terminal based on a first clock signal and a second clock signal, the first clock signal corresponding to the input clock signal and the second clock signal being a delayed signal of the first clock signal; and
a redundant feedback loop, connected to the first data path, to store first data based on at least one of the first or second clock signals when the first data is equal to second data, wherein the first data corresponds to the input data and wherein the second data is delayed data of the first data.

14. The scan chain circuit as claimed in claim 13, wherein the first sequential circuit includes a clock generator to generate the first clock signal based on the input clock signal and the second clock signal by delaying the input clock signal.

15. The scan chain circuit as claimed in claim 13, further comprising:
a clock generator outside the first through N-th sequential circuits, the clock generator to generate the first clock signal based on the input clock signal and the second clock signal by delaying the input clock signal.

16. A circuit, comprising:
a data path, connected to a data input terminal, to transmit input data to an output terminal based on different clock signals; and
a redundant feedback loop, connected to the data path, to store first data based on at least one of the different clock signals when a difference between the first data and second data is in a predetermined range, wherein the first data corresponds to the input data, wherein a first clock signal of the different clock signals is delayed relative to a second clock signal of the different clock signals, and wherein the second data is delayed data of the first data.

17. The circuit as claimed in claim 16, wherein the redundant feedback loop is not to store first data a difference between the first data and second data is outside of the predetermined range.

18. The circuit as claimed in claim 17, wherein the predetermined range corresponds to when the first data equals the second data.

19. The circuit as claimed in claim 16, wherein
the redundant feedback loop includes a first latch connected to a first data node from which the first data is to be provided and a second data node from which the second data is to be provided,
the first latch to store the first data based on the second clock signal when the difference between the first data and the second data is in the predetermined range, and
the first data node is on the data path.

20. The circuit as claimed in claim 19, wherein the redundant feedback loop includes:
a transfer gate to electrically connect an output terminal of the first latch with a third data node based on the first clock signal; and
a second latch connected to the data output terminal and the third data node, the second latch to store the first data based on the first clock signal when the difference between the first data and the second data is in the predetermined range.

* * * * *